United States Patent
Coban et al.

(10) Patent No.: US 11,477,486 B2
(45) Date of Patent: Oct. 18, 2022

(54) ESCAPE CODING FOR COEFFICIENT LEVELS

(71) Applicant: QUALCOMM Incorporated, San Diego, CA (US)

(72) Inventors: Muhammed Zeyd Coban, Carlsbad, CA (US); Marta Karczewicz, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/732,008

(22) Filed: Dec. 31, 2019

(65) Prior Publication Data

US 2020/0213623 A1    Jul. 2, 2020

Related U.S. Application Data

(60) Provisional application No. 62/787,707, filed on Jan. 2, 2019.

(51) Int. Cl.
| | | |
|---|---|---|
| *H04N 19/70* | (2014.01) | |
| *H04N 19/13* | (2014.01) | |
| *H04N 19/176* | (2014.01) | |
| *H04N 19/117* | (2014.01) | |
| *H04N 19/46* | (2014.01) | |

(52) U.S. Cl.
CPC ........... *H04N 19/70* (2014.11); *H04N 19/117* (2014.11); *H04N 19/13* (2014.11); *H04N 19/176* (2014.11); *H04N 19/46* (2014.11)

(58) Field of Classification Search
CPC ...... H04N 19/70; H04N 19/117; H04N 19/13; H04N 19/176; H04N 19/46

USPC ................................................... 375/240.26
See application file for complete search history.

(56) References Cited

U.S. PATENT DOCUMENTS

| | | | |
|---|---|---|---|
| 8,259,807 B2 * | 9/2012 | Liu ........................ | H04N 19/43 |
| | | | 375/240.24 |
| 9,942,567 B2 * | 4/2018 | Kim ........................ | H04N 19/70 |
| 2007/0201554 A1 * | 8/2007 | Sihn ........................ | H04N 19/176 |
| | | | 375/E7.262 |
| 2008/0238733 A1 * | 10/2008 | Suzumura ............... | H03M 7/42 |
| | | | 341/67 |
| 2013/0301738 A1 * | 11/2013 | Kim ........................ | H04N 19/156 |
| | | | 375/240.18 |

(Continued)

OTHER PUBLICATIONS

Heiko Schwarz, CE7: Transform Coefficient coding with reducing number of regular-coded bins (tests 7.1.3A, 7.1.3b), Oct. 3, 2018, pp. 1-14 (Year: 2018).*

(Continued)

*Primary Examiner* — Amir Shahnami
*Assistant Examiner* — Jimmy S Lee
(74) *Attorney, Agent, or Firm* — Shumaker & Sieffert, P.A.

(57) ABSTRACT

As part of bypass decoding syntax elements for a set of coefficients in response to reaching a maximum number of regular coded bins, a video decoder is configured to receive a prefix value for a transform coefficient; decode the prefix value using Golomb-Rice coding; in response to a length of the prefix value being equal to a threshold value, receive a suffix value for the transform coefficient; decode the suffix value using exponential Golomb coding; and determine a level value for the transform coefficient based on the decoded prefix value and the decoded suffix value.

40 Claims, 16 Drawing Sheets

(56) References Cited

U.S. PATENT DOCUMENTS

| | | | | |
|---|---|---|---|---|
| 2014/0334539 | A1* | 11/2014 | Kim | H04N 19/61 |
| | | | | 375/240.03 |
| 2016/0050427 | A1* | 2/2016 | Berry | H04N 19/93 |
| | | | | 375/240.01 |
| 2016/0212427 | A1* | 7/2016 | Yoneoka | H04N 19/176 |
| 2016/0295214 | A1* | 10/2016 | Gamei | H04N 19/91 |
| 2017/0105026 | A1* | 4/2017 | Kim | H03M 7/4075 |
| 2017/0127058 | A1* | 5/2017 | Misra | H04N 19/593 |
| 2020/0045316 | A1* | 2/2020 | Leleannec | H04N 19/147 |

OTHER PUBLICATIONS

Bossen F., "CommonDef.h," Nov. 22, 2018 (Nov. 22, 2018), XP055678543, pp. 1-14, Retrieved from the Internet: URL: https://vcgit.hhi.fraunhofer.de/tlu/VVCSoftware_VTM/-/tree/VTM-3.0/source%2FLib%2FCommonLib/CommonDef.h, [retrieved on Mar. 23, 2020], line 170.

Bossen F., "Proof of dates," Nov. 22, 2018 (Nov. 22, 2018), XP055678455, pp. 1, Retrieved from the Internet: URL: https://vcgit.hhi.fraunhofer.de/tlu/VVCSoftware_VTM/-/tree/VTM-3.0/, [retrieved on Mar. 20, 2020], the whole document.

Bossen F., "BinEncoder.cpp," Nov. 22, 2018 (Nov. 22, 2018), XP055678466, pp. 1-10, Retrieved from the Internet: URL: https://vcgit.hhi.fraunhofer.de/tlu/VVCSoftware_VTM/-/tree/VTM-3.0/source%2FLib%2FEncoderLib/BinEncoder.cpp, [retrieved on Mar. 20, 2020] lines 208-258.

Bossen F., "CABACWriter.cpp," Nov. 22, 2018 (Nov. 22, 2018), XP055678472, pp. 1-55, Retrieved from the Internet: URL: https://vcgit.hhi.fraunhofer.de/tlu/VVCSoftware_VTM/-/tree/VTM-3.0/source%2FLib%2FEncoderLib/CABACWriter.cpp, [retrieved on Mar. 20, 2020], lines 2477-2615.

Bossen F., "Rom.cpp," Nov. 22, 2018 (Nov. 22, 2018), XP055678460, pp. 1-21, Retrieved from the Internet: URL: https://vcgit.hhi.fraunhofer.de/tlu/VVCSoftware_VTM/-/tree/VTM-3.0/source%2FLib%2FCommonLib/Rom.cpp, [retrieved on Mar. 20, 2020], Line 787.

Bross B., et al., "Versatile Video Coding (Draft 6)," Joint Video Experts Team (JVET) of ITU-T SG 16 WP 3 and ISO/IEC JTC 1/SC 29/WG 11, JVET-O2001-vE, Jul. 3-12, 2019, 455 pages.

Chen J., et al., "Algorithm Description of Joint Exploration Test Model 1," 1, JVET Meeting, Oct. 19-21, 2015, Geneva;(The Joint Video Exploration Team of ISO/IEC JTC1/SC29/WG11 and ITU-T SG.16); URL: http://phenix.int-evry.fr/jvet/ ,, No. JVET-A1001 Feb. 24, 2016 (Feb. 24, 2016), XP030150000, 27 pages.

Chien WJ., et al. "On Coefficient Level Remaining Coding," Apr. 27-May 7, 2012; (Joint Collaborative Team on Video Coding of ISO/IEC JTC1/WG11 and ITU-T SG.16); No. JCTVC-I0487, May 3, 2012; 8 pp.

Coban (Qualcomm) M., et al: "CE7-related: Golomb-rice/exponential Golomb Coding for ads_remainder and dec_abs_level syntax elements," 13. JVET Meeting; Jan. 9, 2019-Jan. 18, 2019; Marrakech; (The Joint Video Exploration Team of ISO/IEC JTC1/SC29/WG11 and ITU-T SG.16), No. JVET-M0470, Jan. 3, 2019, XP030200515, Retrieved from the Internet: URL: http://phenix.int-evry.fr/jvet/doc_end_user/documents/13_Marrakech/wg11/JVET-M0470-v1.zip JVET-M0470.docx , 4 pages, [retrieved on Jan. 3, 2019] p. 1.

Ergen S., "ZigBee/IEEE 802.15.4 Summary," Sep. 10, 2004, 37 Pages.

EEE Std 802.11ad-2012: "Part 11: Wireless LAN Medium Access Control (MAC) and Physical Layer (PHY) Specifications—Amendment 3: Enhancements for Very High Throughput in the 60 GHz Band," LAN/MAN Standards Committee of the IEEE Computer Society, Dec. 28, 2012, 628 Pages.

International Search Report and Written Opinion—PCTAPPNO—PCT/US2020/012054—dated Apr. 3, 2020.

ITU-T H.223, Series H: Audiovisual and Multimedia Systems, Infrastructure of Audiovisual Services—Transmission Multiplexing and Synchronization, Multiplexing Protocol for Low Bit Rate Multimedia Communication, The International Telecommunication Union, Jul. 2001, 74 Pages.

ITU-T H.265, "Series H: Audiovisual and Multimedia Systems, Infrastructure of Audiovisual Services—Coding of Moving Video, High efficiency Video Coding," The International Telecommunication Union Dec. 2016, 664 Pages.

Karczewicz M., et al., "AHG18: Limiting the Worst-case Length for coeff_abs_level remaining syntaxElement to 32 bits," Joint Collaborative Team on Video Coding (JCT-VC) of ITU-T SG 16 WP 3 and ISO/IEC JTC 1/SC 29/WG 11, JCTVC-Q0131, 17th Meeting: Valencia, ES, Mar. 27-Apr. 4, 2014, pp. 1-4.

Lou J, et al., "On coeff_abs_level_minus3 coding," 7. JCT-VC Meeting, 98. MPEG Meeting, Nov. 21, 2011-Nov. 30, 2011, Geneva, (Joint Collaborative Team on Video Coding of ISO/IEC JTC1/SC29/WG11 and ITU-T SG.16 ), URL: http://wftp3.itu.int/av-arch/jctvc-site/, No. JCTVC-G700r1, Nov. 9, 2011, (Nov. 9, 2011), XP030110684, pp. 1-7, Section 1.

Nguyen T., et al., "Reduced-Complexity Entropy Coding of Transform Coefficient Levels using Truncated Golomb-Rice Codes in Video Compression," 18th IEEE International Conference on Image Processing (ICIP), 2011, Sep. 11, 2011 (Sep. 11, 2011), pp. 753-756, XP032080600, DOI: 10.1109/ICIP.2011.6116664 ISBN:978-1-4577-1304-0.

Schwarz (Fraunhofer) H., et al., "CE7: Transform Coefficient Coding with Reduced Number of Regular-coded Bins (tests 7.1.3a, 7.1.3b)," Joint Video Experts Team (JVET) of ITU-TSG 16 WP 3 and ISO/IEC JTC 1/SC 29/WG 11 JVET-L0274-v3, 12th Meeting: Macao, CN, XP030194470, Oct. 3, 2018-Oct. 12, 2018, Oct. 3-12, 2018, 19 pages, Retrieved from the Internet: URL: http://phenix.int-evry.fr/jvet/doc_end_user/documents/12_Macao/wg11/JVET-L0274-v3.zip.

Schwarz H., et al., "CE7: Transform Coefficient Coding with Reduced Number of Regular-Coded Bins (tests 7.1.3a, 7.1.3b)," 12. JVET Meeting, Joint Video Experts Team (JVET) of ITU-T SG 16 WP 3 and ISO/IEC JTC 1/SC 29/WG 11, No. JVET-L0274-v1, XP030194467, Oct. 3, 2018-Oct. 12, 2018, Oct. 3, 2018, 14 pages, Retrieved from the Internet:URL:http://phenix.int-evryfr/jvet/doc_end_user/documents/12_Macao/wg11/JVET-L0274-v3.zipJVET-L0274-v3.docx, [retrieved on Oct. 3, 2018], Section 2.2.

Schwarz H., et al., "Non-CE7: Alternative Entropy Coding for Dependent Quantization," 11. JVET Meeting, Joint Video Experts Team (JVET) of ITU-T SG 16 WP 3 and ISO/IEC JTC 1/SC 29/WG 11, JVET-K0072-v2, Jul. 11, 2018-Jul. 18, 2018, XP030199921, Jul. 16, 2018(Jul. 16, 2018), 17 pages. Retrieved from the Internet:URL:http://phenix.int-evry.fr/jvet/doc_end_user/documents/11_Ljubljana/wg11/JVET-K0072-v5.zip JVET-K0072-v2.doc, [retrieved on Jul. 16, 2018], Section 2.

Sole J., et al., "Transform Coefficient Coding in HEVC," IEEE Transactions on Circuits and Systems for Video Technology, IEEE Service Center, Piscataway, NJ, US, vol. 22, No. 12, Dec. 1, 2012 (Dec. 1, 2012), pp. 1765-1777, XP011487805, ISSN: 1051-8215, DOI: 10.1109/TCSVT.2012.2223055.

Xu X., et al., "On Unification of Intra Block Copy and Inter-picture Motion Compensation," 16. JCT-VC Meeting Mar. 27, 2014-Apr. 4, 2014; San Jose; (Joint Collaborative Team on Video Coding of ISO/IEC JTC1/SC29/WG11 and ITU-T SG.16 WP 3); URL: http://wftp3.itu.int/av-arch/jctvc-site/, No. JCTVC-Q0132-V5, Mar. 2014 , XP030116062, 14 pages.

Bossen F., et al., "JVET Common test Conditions and Software Reference Configurations for SDR Video," Joint Video Experts Team (JVET) of ITU-T SG 16 WP 3 and ISO/IEC JTC 1/SC 29/WG 11, Document: JVET-L1010-v1, 12th Meeting: Macao, CN, Oct. 3-12, 2018, pp. 1-5.

Bross B., et al., "Versatile Video Coding (Draft 3)," Joint Video Experts Team (JVET) of ITU-T SG 16 WP 3 and ISO/IEC JTC 1/SC 29/WG 11, 12th Meeting: Macao, CN, JVET-L1001-V7, Oct. 3-12, 2018, 227 Pages.

Budagavi et al., Coeff_abs_level remaining maximum codeword length reduction:, Document: JCTVC-J0142, 10th Meeting, Stockholm, SE Jul. 11-20, 2012, (Joint Collaborative Team on Video Coding (JCT-VC) of ITU-T SG 16 WP 3 and ISO/IEC JTC 1/ SC 29/WG 11 }, JCTVC-J0142_v6, Jan. 7, 2014, 14 pp.

(56) References Cited

OTHER PUBLICATIONS

JVET: "JVET/VVCSoftware_VTM, GitLab," Frank Bossen, https://vcgit.hhi.fraunhofer.de/jvet/VVCSoftware_VTM, Feb. 6, 2020, pp. 1-3.
Schwarz H., et al., "Description of Core Experiment 7 (CE 7): Quantization and Coefficient Coding," Joint Video Experts Team (JVET) of ITU-T SG 16 WP 3 and ISO/IEC JTC 1/SC 29/WG 11, Document: JVET-L1027-v3, 12th Meeting: Macao, CN, Oct. 3-12, 2018, pp. 1-7.
Sharman K., et al., "AHG18: Worst-case Escape Code Length Mitigation," Document: JCTVC-Q0073, 17, JCT-VC Meeting, Mar. 27, 2014-Apr. 4, 2014; Valencia; (Joint Collaborative Team On Video Coding Of ISO/IEC JTC1/SC29/WG11 and ITU-T SG.16 ); URL: http://wftp3.itu.int/av-arch/jctvc-site/,, No. JCTVC-Q0073-v2, Mar. 24, 2014 (Mar. 24, 2014), XP030115973, 6 pages.
International Preliminary Report on Patentability—PCT/US2020/012054 The International Bureau of WIPO—Geneva, Switzerland, dated Jul. 15, 2021, 12 pp.
Bross B., et al., "Versatile Video Coding (Draft 2)", 11. JVET Meeting, Jul. 11, 2018-Jul. 18, 2018, Ljubljana, (The Joint Video Exploration Team of ISO/IEC JTC1/SC29/WG11 and ITU-T SG 16 WP3), No. JVET-K1001-v6, Sep. 21, 2018 (Sep. 21, 2018), XP030193577, 135 Pages, pp. 56-68, paragraph 8.2.4.2—paragraph 8.2.4.2.9; figures 8-1, tables 8-5.
Chuang T.D., et al., "CE7-Related: Constraints on Context-Coded Bins for Coefficient Coding", JVET-L0145_DraftText_M1_M2_M3, 2018, 8 Pages.
Flynn D., et al., "High Efficiency Video Coding (HEVC) Range Extensions Text Specification: Draft 5", Joint Collaborative Team on Video Coding (JCT-VC) of ITU-T SG 16 WP 3 and ISO/IEC JTC 1/SC 29/WG 11, 15th Meeting: Geneva, CH, Document: JCTVC-O1005_V4, Oct. 23-Nov. 1, 2013, 361 Pages, Dec. 27, 2013, JCTVC-O1005 (Version 4), p. 328.
Schwarz H., et al., "CE7: Summary Report on Quantization and Coefficient Coding", JVET-L0027-V1, Joint Video Experts Team (JVET) of ITU-T SG 16 WP 3 and ISO/IEC JTC 1/SC 29/WG 11, 12th Meeting, Macao, CN, Oct. 3-12, 2018, pp. 1-33.
Schwarz H., et al., "CE7: Transform Coefficient Coding with Reduced Number of Regular-Coded Bins (tests 7.1.3a, 7.1.3b)", JVET-L0274 (version B), Draft Text for WC, 2018, 8 Pages.

* cited by examiner

ESCAPE CODING FOR COEFFICIENT LEVELS

This application claims the benefit of U.S. Provisional Application 62/787,707, filed Jan. 2, 2019, the entire content of which is hereby incorporated by reference.

TECHNICAL FIELD

This disclosure relates to video encoding and video decoding.

BACKGROUND

Digital video capabilities can be incorporated into a wide range of devices, including digital televisions, digital direct broadcast systems, wireless broadcast systems, personal digital assistants (PDAs), laptop or desktop computers, tablet computers, e-book readers, digital cameras, digital recording devices, digital media players, video gaming devices, video game consoles, cellular or satellite radio telephones, so-called "smart phones," video teleconferencing devices, video streaming devices, and the like. Digital video devices implement video coding techniques, such as those described in the standards defined by MPEG-2, MPEG-4, ITU-T H.263, ITU-T H.264/MPEG-4, Part 10, Advanced Video Coding (AVC), the High Efficiency Video Coding (HEVC) standard, ITU-T H.265/High Efficiency Video Coding (HEVC), and extensions of such standards. The video devices may transmit, receive, encode, decode, and/or store digital video information more efficiently by implementing such video coding techniques.

Video coding techniques include spatial (intra-picture) prediction and/or temporal (inter-picture) prediction to reduce or remove redundancy inherent in video sequences. For block-based video coding, a video slice (e.g., a video picture or a portion of a video picture) may be partitioned into video blocks, which may also be referred to as coding tree units (CTUs), coding units (CUs) and/or coding nodes. Video blocks in an intra-coded (I) slice of a picture are encoded using spatial prediction with respect to reference samples in neighboring blocks in the same picture. Video blocks in an inter-coded (P or B) slice of a picture may use spatial prediction with respect to reference samples in neighboring blocks in the same picture or temporal prediction with respect to reference samples in other reference pictures. Pictures may be referred to as frames, and reference pictures may be referred to as reference frames.

SUMMARY

Video coding (e.g., video encoding and/or video decoding) typically involves predicting a block of video data from either an already coded block of video data in the same picture (e.g., intra prediction) or an already coded block of video data in a different picture (e.g., inter prediction). In some instances, the video encoder also calculates residual data by comparing the predictive block to the original block. Thus, the residual data represents a difference between the predictive block and the original block of video data. To reduce the number of bits needed to signal the residual data, the video encoder transforms the residual data into transform coefficients, quantizes the transform coefficients, and signals the transformed and quantized coefficients in the encoded bitstream. The compression achieved by the transform and quantization processes may be lossy, meaning that transform and quantization processes may introduce distortion into the decoded video data. This disclosure describes techniques related to transform coefficient coding and more specifically, to using a combination of Golomb-Rice and exponential Golomb coding The techniques of this disclosure may improve the coding efficiency of transform coefficients by reducing, on average, the number of bits needed to signal transform coefficients. The techniques of this disclosure may additionally limit the worst-case coding scenarios associated with signalling transform coefficients.

According to an example of this disclosure, a method for decoding video data includes context decoding syntax elements for a first set of transform coefficients of a transform coefficient group until a maximum number of regular coded bins is reached, wherein the context decoded syntax elements comprise one or more significance flags, one or more parity level flags, and one or more first flags, wherein each of the one or more significance flags indicate if an absolute level for a transform coefficient is equal to zero, each of the one or more parity level flags indicates if a transform coefficient has an absolute level that is even or odd, and each of the one or more first flags indicates if a transform coefficient has an absolute level that is greater than 2; bypass decoding additional syntax elements for a second set of coefficients in response to reaching the maximum number of regular coded bins, wherein bypass decoding the additional syntax elements includes receiving a prefix value for a transform coefficient; decoding the prefix value using Golomb-Rice coding; in response to a length of the prefix value being equal to a threshold value, receiving a suffix value for the transform coefficient; and decoding the suffix value using exponential Golomb coding; determining values for the first set of coefficients of the transform unit based on the context decoded syntax elements; and determining values for the second set of coefficients of the transform unit based on the additional syntax elements, wherein determining the values for the second set of coefficients of the transform unit based on the additional syntax elements comprises determining a level value for the transform coefficient based on the decoded prefix value and the decoded suffix value.

According to another example of this disclosure, a device for decoding video data includes a memory configured to store video data and one or more processors implemented in circuitry and configured to context decode syntax elements for a first set of coefficients of a transform coefficient group until a maximum number of regular coded bins is reached, wherein the context decoded syntax elements comprise one or more significance flags, one or more parity level flags, and one or more first flags, wherein each of the one or more significance flags indicate if an absolute level for a transform coefficient is equal to zero, each of the one or more parity level flags indicates if a transform coefficient has an absolute level that is even or odd, and each of the one or more first flags indicates if a transform coefficient has an absolute level that is greater than 2; bypass decode additional syntax elements for a second set of coefficients in response to reaching the maximum number of regular coded bins, wherein to bypass decode the additional syntax elements, the one or more processors are configured to receive a prefix value for a transform coefficient; decode the prefix value using Golomb-Rice coding; in response to a length of the prefix value being equal to a threshold value, receive a suffix value for the transform coefficient; and decode the suffix value using exponential Golomb coding; determine values for the first set of coefficients of the transform unit based on the context decoded syntax elements; and determine values for the second set of coefficients of the transform unit based on the additional syntax elements, wherein to determine the values for the second set of coefficients of the transform unit based on the additional syntax elements, the one or more processors are configured to determine a level value for the transform coefficient based on the decoded prefix value and the decoded suffix value.

According to another example of this disclosure, a computer readable storage medium stores instructions that when executed by one or more processors cause the one or more processors to context decode syntax elements for a first set of transform coefficients of a transform coefficient group until a maximum number of regular coded bins is reached, wherein the context decoded syntax elements comprise one or more significance flags, one or more parity level flags, and one or more first flags, wherein each of the one or more significance flags indicate if an absolute level for a transform coefficient is equal to zero, each of the one or more parity level flags indicates if a transform coefficient has an absolute level that is even or odd, and each of the one or more first flags indicates if a transform coefficient has an absolute level that is greater than 2; bypass decode additional syntax elements for a second set of coefficients in response to reaching the maximum number of regular coded bins, wherein to bypass decode the additional syntax elements, the instructions cause the one or more processors to receive a prefix value for a transform coefficient; decode the prefix value using Golomb-Rice coding; in response to a length of the prefix value being equal to a threshold value, receive a suffix value for the transform coefficient; and decode the suffix value using exponential Golomb coding; determine values for the first set of coefficients of the transform unit based on the context decoded syntax elements; and determine values for the second set of coefficients of the transform unit based on the additional syntax elements, wherein determining the values for the second set of coefficients of the transform unit based on the additional syntax elements comprises determining a level value for the transform coefficient based on the decoded prefix value and the decoded suffix value.

According to another example of this disclosure, an apparatus for decoding video data includes means for context decoding syntax elements for a first set of transform coefficients of a transform coefficient group until a maximum number of regular coded bins is reached, wherein the context decoded syntax elements comprise one or more significance flags, one or more parity level flags, and one or more first flags, wherein each of the one or more significance flags indicate if an absolute level for a transform coefficient is equal to zero, each of the one or more parity level flags indicates if a transform coefficient has an absolute level that is even or odd, and each of the one or more first flags indicates if a transform coefficient has an absolute level that is greater than 2; means for bypass decoding additional syntax elements for a second set of coefficients in response to reaching the maximum number of regular coded bins, wherein the means for bypass decoding the additional syntax elements comprises means for receiving a prefix value for a transform coefficient; means for decoding the prefix value using Golomb-Rice coding; means for receiving a suffix value for the transform coefficient in response to a length of the prefix value being equal to a threshold value; and means for decoding the suffix value using exponential Golomb coding; means for determining values for the first set of coefficients of the transform unit based on the context decoded syntax elements; and means for determining values for the second set of coefficients of the transform unit based on the additional syntax elements, wherein determining the values for the second set of coefficients of the transform unit based on the additional syntax elements comprises determining a level value for the transform coefficient based on the decoded prefix value and the decoded suffix value.

According to another example of this disclosure, a method of encoding video data includes determining values for coefficients of a transform coefficient group; context encoding syntax elements for a first set of coefficients of the transform coefficient group until a maximum number of regular coded bins is reached, wherein the context encoded syntax elements comprise one or more significance flags, one or more parity level flags, and one or more first flags, wherein each of the one or more significance flags indicate if an absolute level for a transform coefficient is equal to zero, each of the one or more parity level flags indicates if a transform coefficient has an absolute level that is even or odd, and each of the one or more first flags indicates if a transform coefficient has an absolute level that is greater than 2; bypass encoding additional syntax elements for a second set of coefficients of the transform coefficient group in response to reaching the maximum number of regular coded bins, wherein bypass encoding the additional syntax elements includes determining a level value for a transform coefficient of the second set of coefficients; in response to the level value being greater than a threshold value, encoding a prefix value for the transform coefficient using Golomb-Rice coding; and in response to the level value being greater than the threshold value, encoding a suffix value using exponential Golomb coding.

According to another example of this disclosure, a device for encoding video data includes a memory configured to store video data and one or more processors implemented in circuitry and configured to determine values for coefficients of a transform coefficient group; context encode syntax elements for a first set of coefficients of the transform coefficient group until a maximum number of regular coded bins is reached, wherein the context encoded syntax elements comprise one or more significance flags, one or more parity level flags, and one or more first flags, wherein each of the one or more significance flags indicate if an absolute level for a transform coefficient is equal to zero, each of the one or more parity level flags indicates if a transform coefficient has an absolute level that is even or odd, and each of the one or more first flags indicates if a transform coefficient has an absolute level that is greater than 2; bypass encode additional syntax elements for a second set of coefficients of the transform coefficient group in response to reaching the maximum number of regular coded bins, wherein bypass encoding the additional syntax elements includes determine a level value for a transform coefficient of the second set of coefficients; in response to the level value being greater than a threshold value, encode a prefix value for the transform coefficient using Golomb-Rice coding; and in response to the level value being greater than the threshold value, encode a suffix value using exponential Golomb coding.

According to another example of this disclosure, a computer readable storage medium stores instructions that when executed by one or more processors cause the one or more processors to determine values for coefficients of a transform coefficient group; context encode syntax elements for a first set of coefficients of the transform coefficient group until a maximum number of regular coded bins is reached, wherein the context encoded syntax elements comprise one or more significance flags, one or more parity level flags, and one or more first flags, wherein each of the one or more significance flags indicate if an absolute level for a transform coefficient is equal to zero, each of the one or more parity level flags indicates if a transform coefficient has an absolute level that is even or odd, and each of the one or more first flags indicates if a transform coefficient has an absolute level that is greater than 2; bypass encode additional syntax elements for a second set of coefficients of the transform coefficient group in response to reaching the maximum number of regular coded bins, wherein to bypass encode the additional syntax elements, the instructions cause the one or more processors to determine a level value for a transform coefficient of the second set of coefficients; in response to the level value being greater than a threshold value, encode a prefix value for the transform coefficient using Golomb-Rice coding; and in response to the level value being greater than the threshold value, encode a suffix value using exponential Golomb coding.

According to another example of this disclosure, an apparatus for encoding video data includes means for determining values for coefficients of a transform coefficient group; means for context encoding syntax elements for a first set of coefficients of the transform coefficient group until a maximum number of regular coded bins is reached, wherein the context encoded syntax elements comprise one or more significance flags, one or more parity level flags, and one or more first flags, wherein each of the one or more significance flags indicate if an absolute level for a transform coefficient is equal to zero, each of the one or more parity level flags indicates if a transform coefficient has an absolute level that is even or odd, and each of the one or more first flags indicates if a transform coefficient has an absolute level that is greater than 2; means for bypass encoding additional syntax elements for a second set of coefficients of the transform coefficient group in response to reaching the maximum number of regular coded bins, wherein the means for bypass encoding the additional syntax elements includes means for determining a level value for a transform coefficient of the second set of coefficients; means for encoding a prefix value for the transform coefficient using Golomb-Rice coding in response to the level value being greater than a threshold value; and means for encoding a suffix value using exponential Golomb coding in response to the level value being greater than the threshold value.

The details of one or more examples are set forth in the accompanying drawings and the description below. Other features, objects, and advantages will be apparent from the description, drawings, and claims.

DETAILED DESCRIPTION

Figure 1:
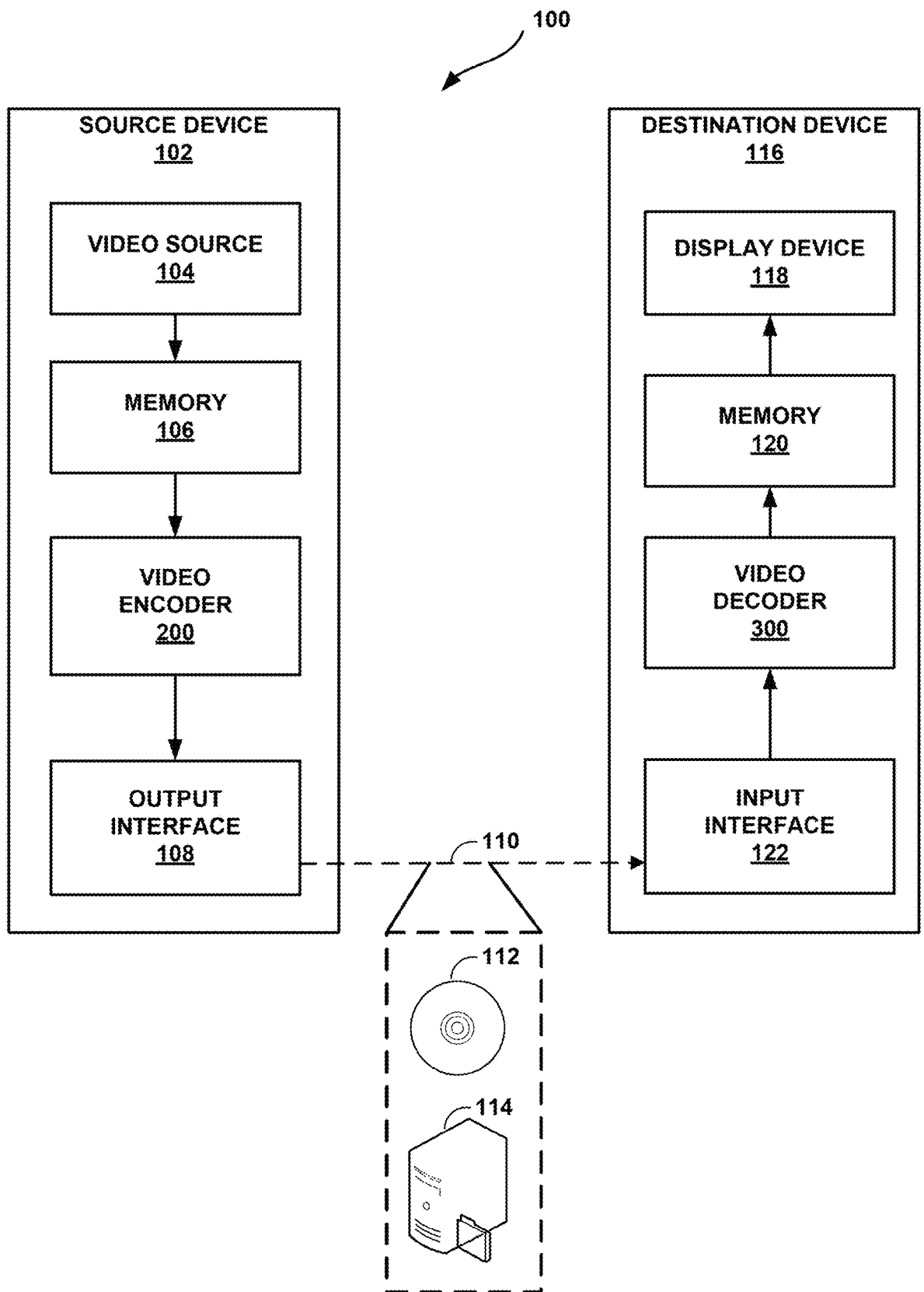
FIG. 1 is a block diagram illustrating an example video encoding and decoding system that may perform the techniques of this disclosure.

Video coding (e.g., video encoding and/or video decoding) typically involves predicting a block of video data from either an already coded block of video data in the same picture (e.g., intra prediction) or an already coded block of video data in a different picture (e.g., inter prediction). In some instances, the video encoder also calculates residual data by comparing the predictive block to the original block. Thus, the residual data represents a difference between the predictive block and the original block of video data. To reduce the number of bits needed to signal the residual data, the video encoder transforms and quantizes the residual data and signals the transformed and quantized residual data in the encoded bitstream. The compression achieved by the transform and quantization processes may be lossy, meaning that the transform and quantization processes may introduce distortion into the decoded video data.

A video decoder decodes and adds the residual data to the predictive block to produce a reconstructed video block that matches the original video block more closely than the predictive block alone. Due to the loss introduced by the transforming and quantizing of the residual data, the reconstructed block may have distortion or artifacts. One common type of artifact or distortion is referred to as blockiness, where the boundaries of the blocks used to code the video data are visible.

To further improve the quality of decoded video, a video decoder can perform one or more filtering operations on the reconstructed video blocks. Examples of these filtering operations include deblocking filtering, sample adaptive offset (SAO) filtering, and adaptive loop filtering (ALF). Parameters for these filtering operations may either be determined by a video encoder and explicitly signaled in the encoded video bitstream or may be implicitly determined by a video decoder without needing the parameters to be explicitly signaled in the encoded video bitstream.

As introduced above, a video encoder transforms residual data to produce transform coefficients. Those transform coefficients may additionally be quantized. In this disclosure, the term transform coefficient, or coefficient, may refer to either a quantized transform coefficient or an unquantized transform coefficient. This disclosure describes techniques for signaling the values of transform coefficients, e.g., quantized transform coefficients, from a video encoder to a video decoder. Such techniques include techniques related to an entropy decoding process that converts a binary representation of bits to a series of non-binary valued quantized transform coefficients. More specifically, this disclosure describes techniques for coding of escape codes representing a non-context coded portion of coefficient level that is instead coded as a Golomb-Rice/exponetial Golomb combination. The corresponding entropy encoding process, which is generally the reverse process of entropy decoding, is also described in this disclosure.

The techniques of this disclosure may be implemented in conjunction with techniques of existing video codecs, such as High Efficiency Video Coding (HEVC), or be included as part of future video codecs, such as the Versatile Video Coding (VVC) standard that is presently under development.

FIG. 1 is a block diagram illustrating an example video encoding and decoding system 100 that may perform the techniques of this disclosure. The techniques of this disclosure are generally directed to coding (encoding and/or decoding) video data. In general, video data includes any data for processing a video. Thus, video data may include raw, uncoded video, encoded video, decoded (e.g., reconstructed) video, and video metadata, such as signaling data.

As shown in FIG. 1, system 100 includes a source device 102 that provides encoded video data to be decoded and displayed by a destination device 116, in this example. In particular, source device 102 provides the video data to destination device 116 via a computer-readable medium 110. Source device 102 and destination device 116 may be any of a wide range of devices, including desktop computers, notebook (i.e., laptop) computers, tablet computers, set-top boxes, telephone handsets such smartphones, televisions, cameras, display devices, digital media players, video gaming consoles, video streaming device, or the like. In some cases, source device 102 and destination device 116 may be equipped for wireless communication, and thus may be referred to as wireless communication devices.

In the example of FIG. 1, source device 102 includes video source 104, memory 106, video encoder 200, and output interface 108. Destination device 116 includes input interface 122, video decoder 300, memory 120, and display device 118. In accordance with this disclosure, video encoder 200 of source device 102 and video decoder 300 of destination device 116 may be configured to apply the techniques for coefficient coding described in this disclosure. Thus, source device 102 represents an example of a video encoding device, while destination device 116 represents an example of a video decoding device. In other examples, a source device and a destination device may include other components or arrangements. For example, source device 102 may receive video data from an external video source, such as an external camera. Likewise, destination device 116 may interface with an external display device, rather than including an integrated display device.

System 100 as shown in FIG. 1 is merely one example. In general, any digital video encoding and/or decoding device may perform the techniques for coefficient coding described herein. Source device 102 and destination device 116 are merely examples of such coding devices in which source device 102 generates coded video data for transmission to destination device 116. This disclosure refers to a "coding" device as a device that performs coding (encoding and/or decoding) of data. Thus, video encoder 200 and video decoder 300 represent examples of coding devices, in particular, a video encoder and a video decoder, respectively. In some examples, source device 102 and destination device 116 may operate in a substantially symmetrical manner such that each of source device 102 and destination device 116 includes video encoding and decoding components. Hence, system 100 may support one-way or two-way video transmission between source device 102 and destination device 116, e.g., for video streaming, video playback, video broadcasting, or video telephony.

In general, video source 104 represents a source of video data (i.e., raw, unencoded video data) and provides a sequential series of pictures (also referred to as "frames") of the video data to video encoder 200, which encodes data for the pictures. Video source 104 of source device 102 may include a video capture device, such as a video camera, a video archive containing previously captured raw video, and/or a video feed interface to receive video from a video content provider. As a further alternative, video source 104 may generate computer graphics-based data as the source video, or a combination of live video, archived video, and computer-generated video. In each case, video encoder 200 encodes the captured, pre-captured, or computer-generated video data. Video encoder 200 may rearrange the pictures from the received order (sometimes referred to as "display order") into a coding order for coding. Video encoder 200 may generate a bitstream including encoded video data. Source device 102 may then output the encoded video data via output interface 108 onto computer-readable medium 110 for reception and/or retrieval by, e.g., input interface 122 of destination device 116.

Memory 106 of source device 102 and memory 120 of destination device 116 represent general purpose memories. In some examples, memories 106, 120 may store raw video data, e.g., raw video from video source 104 and raw, decoded video data from video decoder 300. Additionally or alternatively, memories 106, 120 may store software instructions executable by, e.g., video encoder 200 and video decoder 300, respectively. Although memory 106 and memory 120 are shown separately from video encoder 200 and video decoder 300 in this example, it should be understood that video encoder 200 and video decoder 300 may also include internal memories for functionally similar or equivalent purposes. Furthermore, memories 106, 120 may store encoded video data, e.g., output from video encoder 200 and input to video decoder 300. In some examples, portions of memories 106, 120 may be allocated as one or more video buffers, e.g., to store raw, decoded, and/or encoded video data.

Computer-readable medium 110 may represent any type of medium or device capable of transporting the encoded video data from source device 102 to destination device 116. In one example, computer-readable medium 110 represents a communication medium to enable source device 102 to transmit encoded video data directly to destination device 116 in real-time, e.g., via a radio frequency network or computer-based network. Output interface 108 may modulate a transmission signal including the encoded video data, and input interface 122 may demodulate the received transmission signal, according to a communication standard, such as a wireless communication protocol. The communication medium may comprise any wireless or wired communication medium, such as a radio frequency (RF) spectrum or one or more physical transmission lines. The communication medium may form part of a packet-based network, such as a local area network, a wide-area network, or a global network such as the Internet. The communication medium may include routers, switches, base stations, or any other equipment that may be useful to facilitate communication from source device 102 to destination device 116.

In some examples, source device 102 may output encoded data from output interface 108 to storage device 112. Similarly, destination device 116 may access encoded data from storage device 112 via input interface 122. Storage device 112 may include any of a variety of distributed or locally accessed data storage media such as a hard drive, Blu-ray discs, DVDs, CD-ROMs, flash memory, volatile or non-volatile memory, or any other suitable digital storage media for storing encoded video data.

In some examples, source device 102 may output encoded video data to file server 114 or another intermediate storage device that may store the encoded video generated by source device 102. Destination device 116 may access stored video data from file server 114 via streaming or download. File server 114 may be any type of server device capable of storing encoded video data and transmitting that encoded video data to the destination device 116. File server 114 may represent a web server (e.g., for a website), a File Transfer Protocol (FTP) server, a content delivery network device, or a network attached storage (NAS) device. Destination device 116 may access encoded video data from file server 114 through any standard data connection, including an Internet connection. This may include a wireless channel (e.g., a Wi-Fi connection), a wired connection (e.g., digital subscriber line (DSL), cable modem, etc.), or a combination of both that is suitable for accessing encoded video data stored on file server 114. File server 114 and input interface 122 may be configured to operate according to a streaming transmission protocol, a download transmission protocol, or a combination thereof.

Output interface 108 and input interface 122 may represent wireless transmitters/receivers, modems, wired networking components (e.g., Ethernet cards), wireless communication components that operate according to any of a variety of IEEE 802.11 standards, or other physical components. In examples where output interface 108 and input interface 122 comprise wireless components, output interface 108 and input interface 122 may be configured to transfer data, such as encoded video data, according to a cellular communication standard, such as 4G, 4G-LTE (Long-Term Evolution), LTE Advanced, 5G, or the like. In some examples where output interface 108 comprises a wireless transmitter, output interface 108 and input interface 122 may be configured to transfer data, such as encoded video data, according to other wireless standards, such as an IEEE 802.11 specification, an IEEE 802.15 specification (e.g., ZigBee™), a Bluetooth™ standard, or the like. In some examples, source device 102 and/or destination device 116 may include respective system-on-a-chip (SoC) devices. For example, source device 102 may include an SoC device to perform the functionality attributed to video encoder 200 and/or output interface 108, and destination device 116 may include an SoC device to perform the functionality attributed to video decoder 300 and/or input interface 122.

The techniques of this disclosure may be applied to video coding in support of any of a variety of multimedia applications, such as over-the-air television broadcasts, cable television transmissions, satellite television transmissions, Internet streaming video transmissions, such as dynamic adaptive streaming over HTTP (DASH), digital video that is encoded onto a data storage medium, decoding of digital video stored on a data storage medium, or other applications.

Input interface 122 of destination device 116 receives an encoded video bitstream from computer-readable medium 110 (e.g., a communication medium, storage device 112, file server 114, or the like). The encoded video bitstream may include signaling information defined by video encoder 200, which is also used by video decoder 300, such as syntax elements having values that describe characteristics and/or processing of video blocks or other coded units (e.g., slices, pictures, groups of pictures, sequences, or the like). Display device 118 displays decoded pictures of the decoded video data to a user. Display device 118 may represent any of a variety of display devices such as a cathode ray tube (CRT), a liquid crystal display (LCD), a plasma display, an organic light emitting diode (OLED) display, or another type of display device.

Although not shown in FIG. 1, in some examples, video encoder 200 and video decoder 300 may each be integrated with an audio encoder and/or audio decoder, and may include appropriate MUX-DEMUX units, or other hardware and/or software, to handle multiplexed streams including both audio and video in a common data stream. If applicable, MUX-DEMUX units may conform to the ITU H.223 multiplexer protocol, or other protocols such as the user datagram protocol (UDP).

Video encoder 200 and video decoder 300 each may be implemented as any of a variety of suitable encoder and/or decoder circuitry, such as one or more microprocessors, digital signal processors (DSPs), application specific integrated circuits (ASICs), field programmable gate arrays (FPGAs), discrete logic, software, hardware, firmware or any combinations thereof. When the techniques are implemented partially in software, a device may store instructions for the software in a suitable, non-transitory computer-readable medium and execute the instructions in hardware using one or more processors to perform the techniques of this disclosure. Each of video encoder 200 and video decoder 300 may be included in one or more encoders or decoders, either of which may be integrated as part of a combined encoder/decoder (CODEC) in a respective device. A device including video encoder 200 and/or video decoder 300 may comprise an integrated circuit, a microprocessor, and/or a wireless communication device, such as a cellular telephone.

Video encoder 200 and video decoder 300 may operate according to a video coding standard, such as ITU-T H.265, also referred to as High Efficiency Video Coding (HEVC) or extensions thereto, such as the multi-view and/or scalable video coding extensions. Alternatively, video encoder 200 and video decoder 300 may operate according to other proprietary or industry standards, such as the Joint Exploration Test Model (JEM) or ITU-T H.266, also referred to as Versatile Video Coding (VVC). A recent draft of the VVC standard is described in Bross, et al. "Versatile Video Coding (Draft 6)," Joint Video Experts Team (JVET) of ITU-T SG 16 WP 3 and ISO/IEC JTC 1/SC 29/WG 11, 15th Meeting: Gothenburg, SE, 3-12 Jul. 2019, JVET-O2001-vE (hereinafter "VVC Draft 6"). The techniques of this disclosure, however, are not limited to any particular coding standard.

In general, video encoder 200 and video decoder 300 may perform block-based coding of pictures. The term "block" generally refers to a structure including data to be processed (e.g., encoded, decoded, or otherwise used in the encoding and/or decoding process). For example, a block may include a two-dimensional matrix of samples of luminance and/or chrominance data. In general, video encoder 200 and video decoder 300 may code video data represented in a YUV (e.g., Y, Cb, Cr) format. That is, rather than coding red, green, and blue (RGB) data for samples of a picture, video encoder 200 and video decoder 300 may code luminance and chrominance components, where the chrominance components may include both red hue and blue hue chrominance components. In some examples, video encoder 200 converts received RGB formatted data to a YUV representation prior to encoding, and video decoder 300 converts the YUV representation to the RGB format. Alternatively, pre- and post-processing units (not shown) may perform these conversions.

This disclosure may generally refer to coding (e.g., encoding and decoding) of pictures to include the process of encoding or decoding data of the picture. Similarly, this disclosure may refer to coding of blocks of a picture to include the process of encoding or decoding data for the blocks, e.g., prediction and/or residual coding. An encoded video bitstream generally includes a series of values for syntax elements representative of coding decisions (e.g., coding modes) and partitioning of pictures into blocks. Thus, references to coding a picture or a block should generally be understood as coding values for syntax elements forming the picture or block.

HEVC defines various blocks, including coding units (CUs), prediction units (PUs), and transform units (TUs). According to HEVC, a video coder (such as video encoder 200) partitions a coding tree unit (CTU) into CUs according to a quadtree structure. That is, the video coder partitions CTUs and CUs into four equal, non-overlapping squares, and each node of the quadtree has either zero or four child nodes. Nodes without child nodes may be referred to as "leaf nodes," and CUs of such leaf nodes may include one or more PUs and/or one or more TUs. The video coder may further partition PUs and TUs. For example, in HEVC, a residual quadtree (RQT) represents partitioning of TUs. In HEVC, PUs represent inter-prediction data, while TUs represent residual data. CUs that are intra-predicted include intra-prediction information, such as an intra-mode indication.

As another example, video encoder 200 and video decoder 300 may be configured to operate according to JEM or VVC. According to JEM or VVC, a video coder (such as video encoder 200) partitions a picture into a plurality of coding tree units (CTUs). Video encoder 200 may partition a CTU according to a tree structure, such as a quadtree-binary tree (QTBT) structure or Multi-Type Tree (MTT) structure. The QTBT structure removes the concepts of multiple partition types, such as the separation between CUs, PUs, and TUs of HEVC. A QTBT structure includes two levels: a first level partitioned according to quadtree partitioning, and a second level partitioned according to binary tree partitioning. A root node of the QTBT structure corresponds to a CTU. Leaf nodes of the binary trees correspond to coding units (CUs).

In an MTT partitioning structure, blocks may be partitioned using a quadtree (QT) partition, a binary tree (BT) partition, and one or more types of triple tree (TT) (also called ternary tree (TT)) partitions. A triple or ternary tree partition is a partition where a block is split into three sub-blocks. In some examples, a triple or ternary tree partition divides a block into three sub-blocks without dividing the original block through the center. The partitioning types in MTT (e.g., QT, BT, and TT), may be symmetrical or asymmetrical.

In some examples, video encoder 200 and video decoder 300 may use a single QTBT or MTT structure to represent each of the luminance and chrominance components, while in other examples, video encoder 200 and video decoder 300 may use two or more QTBT or MTT structures, such as one QTBT/MTT structure for the luminance component and another QTBT/MTT structure for both chrominance components (or two QTBT/MTT structures for respective chrominance components).

Video encoder 200 and video decoder 300 may be configured to use quadtree partitioning per HEVC, QTBT partitioning, MTT partitioning, or other partitioning structures. For purposes of explanation, the description of the techniques of this disclosure is presented with respect to QTBT partitioning. However, it should be understood that the techniques of this disclosure may also be applied to video coders configured to use quadtree partitioning, or other types of partitioning as well.

The blocks (e.g., CTUs or CUs) may be grouped in various ways in a picture. As one example, a brick may refer to a rectangular region of CTU rows within a particular tile in a picture. A tile may be a rectangular region of CTUs within a particular tile column and a particular tile row in a picture. A tile column refers to a rectangular region of CTUs having a height equal to the height of the picture and a width specified by syntax elements (e.g., such as in a picture parameter set). A tile row refers to a rectangular region of CTUs having a height specified by syntax elements (e.g., such as in a picture parameter set) and a width equal to the width of the picture.

In some examples, a tile may be partitioned into multiple bricks, each of which may include one or more CTU rows within the tile. A tile that is not partitioned into multiple bricks may also be referred to as a brick. However, a brick that is a true subset of a tile may not be referred to as a tile.

The bricks in a picture may also be arranged in a slice. A slice may be an integer number of bricks of a picture that may be exclusively contained in a single network abstraction layer (NAL) unit. In some examples, a slice includes either a number of complete tiles or only a consecutive sequence of complete bricks of one tile.

This disclosure may use "N×N" and "N by N" interchangeably to refer to the sample dimensions of a block (such as a CU or other video block) in terms of vertical and horizontal dimensions, e.g., 16×16 samples or 16 by 16 samples. In general, a 16×16 CU will have 16 samples in a vertical direction (y=16) and 16 samples in a horizontal direction (x=16). Likewise, an N×N CU generally has N samples in a vertical direction and N samples in a horizontal direction, where N represents a nonnegative integer value. The samples in a CU may be arranged in rows and columns. Moreover, CUs need not necessarily have the same number of samples in the horizontal direction as in the vertical direction. For example, CUs may comprise N×M samples, where M is not necessarily equal to N.

Video encoder 200 encodes video data for CUs representing prediction and/or residual information, and other information. The prediction information indicates how the CU is to be predicted in order to form a prediction block for the CU. The residual information generally represents sample-by-sample differences between samples of the CU prior to encoding and the prediction block.

To predict a CU, video encoder 200 may generally form a prediction block for the CU through inter-prediction or intra-prediction. Inter-prediction generally refers to predicting the CU from data of a previously coded picture, whereas intra-prediction generally refers to predicting the CU from previously coded data of the same picture. To perform inter-prediction, video encoder 200 may generate the prediction block using one or more motion vectors. Video encoder 200 may generally perform a motion search to identify a reference block that closely matches the CU, e.g., in terms of differences between the CU and the reference block. Video encoder 200 may calculate a difference metric using a sum of absolute difference (SAD), sum of squared differences (SSD), mean absolute difference (MAD), mean squared differences (MSD), or other such difference calculations to determine whether a reference block closely matches the current CU. In some examples, video encoder 200 may predict the current CU using uni-directional prediction or bi-directional prediction.

Some examples of JEM and VVC also provide an affine motion compensation mode, which may be considered an inter-prediction mode. In affine motion compensation mode, video encoder 200 may determine two or more motion vectors that represent non-translational motion, such as zoom in or out, rotation, perspective motion, or other irregular motion types.

To perform intra-prediction, video encoder 200 may select an intra-prediction mode to generate the prediction block. Some examples of JEM and VVC provide sixty-seven intra-prediction modes, including various directional modes, as well as planar mode and DC mode. In general, video encoder 200 selects an intra-prediction mode that describes neighboring samples to a current block (e.g., a block of a CU) from which to predict samples of the current block. Such samples may generally be above, above and to the left, or to the left of the current block in the same picture as the current block, assuming video encoder 200 codes CTUs and CUs in raster scan order (left to right, top to bottom).

Video encoder 200 encodes data representing the prediction mode for a current block. For example, for inter-prediction modes, video encoder 200 may encode data representing which of the various available inter-prediction modes is used, as well as motion information for the corresponding mode. For uni-directional or bi-directional inter-prediction, for example, video encoder 200 may encode motion vectors using advanced motion vector prediction (AMVP) or merge mode. Video encoder 200 may use similar modes to encode motion vectors for affine motion compensation mode.

Following prediction, such as intra-prediction or inter-prediction of a block, video encoder 200 may calculate residual data for the block. The residual data, such as a residual block, represents sample by sample differences between the block and a prediction block for the block, formed using the corresponding prediction mode. Video encoder 200 may apply one or more transforms to the residual block, to produce transformed data in a transform domain instead of the sample domain. For example, video encoder 200 may apply a discrete cosine transform (DCT), an integer transform, a wavelet transform, or a conceptually similar transform to residual video data. Additionally, video encoder 200 may apply a secondary transform following the first transform, such as a mode-dependent non-separable secondary transform (MDNSST), a signal dependent transform, a Karhunen-Loeve transform (KLT), or the like. Video encoder 200 produces transform coefficients following application of the one or more transforms.

As noted above, following any transforms to produce transform coefficients, video encoder 200 may perform quantization of the transform coefficients. Quantization generally refers to a process in which transform coefficients are quantized to possibly reduce the amount of data used to represent the transform coefficients, providing further compression. By performing the quantization process, video encoder 200 may reduce the bit depth associated with some or all of the transform coefficients. For example, video encoder 200 may round an n-bit value down to an m-bit value during quantization, where n is greater than m. In some examples, to perform quantization, video encoder 200 may perform a bitwise right-shift of the value to be quantized.

Following quantization, video encoder 200 may scan the transform coefficients, producing a one-dimensional vector from the two-dimensional matrix including the quantized transform coefficients. The scan may be designed to place higher energy (and therefore lower frequency) transform coefficients at the front of the vector and to place lower energy (and therefore higher frequency) transform coefficients at the back of the vector. In some examples, video encoder 200 may utilize a predefined scan order to scan the quantized transform coefficients to produce a serialized vector, and then entropy encode the quantized transform coefficients of the vector. In other examples, video encoder 200 may perform an adaptive scan. After scanning the quantized transform coefficients to form the one-dimensional vector, video encoder 200 may entropy encode the one-dimensional vector, e.g., according to context-adaptive binary arithmetic coding (CABAC). Video encoder 200 may also entropy encode values for syntax elements describing metadata associated with the encoded video data for use by video decoder 300 in decoding the video data.

To perform CABAC, video encoder 200 may assign a context within a context model to a symbol to be transmitted. The context may relate to, for example, whether neighboring values of the symbol are zero-valued or not. The probability determination may be based on a context assigned to the symbol.

Video encoder 200 may further generate syntax data, such as block-based syntax data, picture-based syntax data, and sequence-based syntax data, to video decoder 300, e.g., in a picture header, a block header, a slice header, or other syntax data, such as a sequence parameter set (SPS), picture parameter set (PPS), or video parameter set (VPS). Video decoder 300 may likewise decode such syntax data to determine how to decode corresponding video data.

In this manner, video encoder 200 may generate a bitstream including encoded video data, e.g., syntax elements describing partitioning of a picture into blocks (e.g., CUs) and prediction and/or residual information for the blocks. Ultimately, video decoder 300 may receive the bitstream and decode the encoded video data.

In general, video decoder 300 performs a reciprocal process to that performed by video encoder 200 to decode the encoded video data of the bitstream. For example, video decoder 300 may decode values for syntax elements of the bitstream using CABAC in a manner substantially similar to, albeit reciprocal to, the CABAC encoding process of video encoder 200. The syntax elements may define partitioning information of a picture into CTUs, and partitioning of each CTU according to a corresponding partition structure, such as a QTBT structure, to define CUs of the CTU. The syntax elements may further define prediction and residual information for blocks (e.g., CUs) of video data.

The residual information may be represented by, for example, quantized transform coefficients. Video decoder 300 may inverse quantize and inverse transform the quantized transform coefficients of a block to reproduce a residual block for the block. Video decoder 300 uses a signaled prediction mode (intra- or inter-prediction) and related prediction information (e.g., motion information for inter-prediction) to form a prediction block for the block. Video decoder 300 may then combine the prediction block and the residual block (on a sample-by-sample basis) to reproduce the original block. Video decoder 300 may perform additional processing, such as performing a deblocking process to reduce visual artifacts along boundaries of the block.

This disclosure may generally refer to "signaling" certain information, such as syntax elements. The term "signaling" may generally refer to the communication of values for syntax elements and/or other data used to decode encoded video data. That is, video encoder 200 may signal values for syntax elements in the bitstream. In general, signaling refers to generating a value in the bitstream. As noted above, since source device 102 may transport the bitstream to destination device 116 substantially in real time, or not in real time, such as might occur when storing syntax elements to storage device 112 for later retrieval by destination device 116.

Figure 2A:
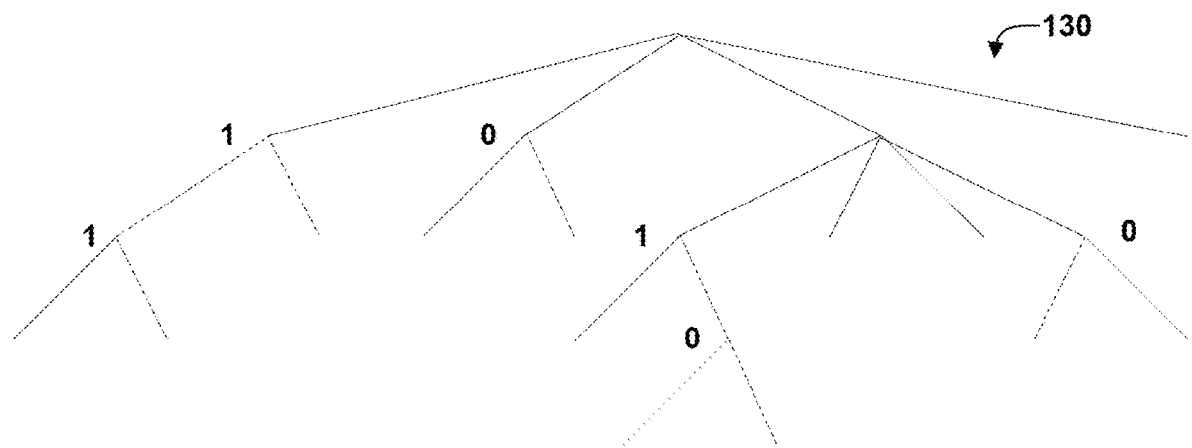
FIGS. 2A and 2B are conceptual diagrams illustrating an example quadtree binary tree (QTBT) structure, and a corresponding coding tree unit (CTU).
Figure 2B:
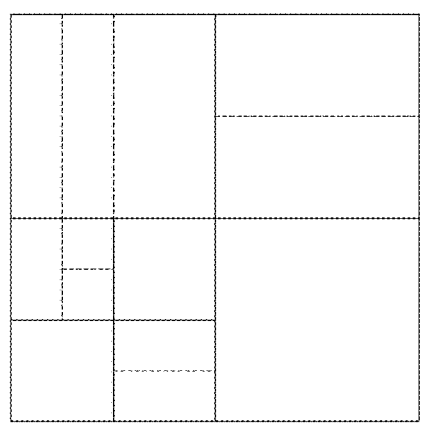

FIGS. 2A and 2B are conceptual diagram illustrating an example quadtree binary tree (QTBT) structure 130, and a corresponding coding tree unit (CTU) 132. The solid lines represent quadtree splitting, and dotted lines indicate binary tree splitting. In each split (i.e., non-leaf) node of the binary tree, one flag is signaled to indicate which splitting type (i.e., horizontal or vertical) is used, where 0 indicates horizontal splitting and 1 indicates vertical splitting in this example. For the quadtree splitting, there is no need to indicate the splitting type, since quadtree nodes split a block horizontally and vertically into 4 sub-blocks with equal size. Accordingly, video encoder 200 may encode, and video decoder 300 may decode, syntax elements (such as splitting information) for a region tree level of QTBT structure 130 (i.e., the solid lines) and syntax elements (such as splitting information) for a prediction tree level of QTBT structure 130 (i.e., the dashed lines). Video encoder 200 may encode, and video decoder 300 may decode, video data, such as prediction and transform data, for CUs represented by terminal leaf nodes of QTBT structure 130.

In general, CTU 132 of FIG. 2B may be associated with parameters defining sizes of blocks corresponding to nodes of QTBT structure 130 at the first and second levels. These parameters may include a CTU size (representing a size of CTU 132 in samples), a minimum quadtree size (MinQTSize, representing a minimum allowed quadtree leaf node size), a maximum binary tree size (MaxBTSize, representing a maximum allowed binary tree root node size), a maximum binary tree depth (MaxBTDepth, representing a maximum allowed binary tree depth), and a minimum binary tree size (MinBTSize, representing the minimum allowed binary tree leaf node size).

The root node of a QTBT structure corresponding to a CTU may have four child nodes at the first level of the QTBT structure, each of which may be partitioned according to quadtree partitioning. That is, nodes of the first level are either leaf nodes (having no child nodes) or have four child nodes. The example of QTBT structure 130 represents such nodes as including the parent node and child nodes having solid lines for branches. If nodes of the first level are not larger than the maximum allowed binary tree root node size (MaxBTSize), then the nodes can be further partitioned by respective binary trees. The binary tree splitting of one node can be iterated until the nodes resulting from the split reach the minimum allowed binary tree leaf node size (MinBTSize) or the maximum allowed binary tree depth (MaxBTDepth). The example of QTBT structure 130 represents such nodes as having dashed lines for branches. The binary tree leaf node is referred to as a coding unit (CU), which is used for prediction (e.g., intra-picture or inter-picture prediction) and transform, without any further partitioning. As discussed above, CUs may also be referred to as "video blocks" or "blocks."

In one example of the QTBT partitioning structure, the CTU size is set as 128×128 (luma samples and two corresponding 64×64 chroma samples), the MinQTSize is set as 16×16, the MaxBTSize is set as 64×64, the MinBTSize (for both width and height) is set as 4, and the MaxBTDepth is set as 4. The quadtree partitioning is applied to the CTU first to generate quad-tree leaf nodes. The quadtree leaf nodes may have a size from 16×16 (i.e., the MinQTSize) to 128×128 (i.e., the CTU size). If the leaf quadtree node is 128×128, it will not be further split by the binary tree, since the size exceeds the MaxBTSize (i.e., 64×64, in this example). Otherwise, the leaf quadtree node will be further partitioned by the binary tree. Therefore, the quadtree leaf node is also the root node for the binary tree and has the binary tree depth as 0. When the binary tree depth reaches MaxBTDepth (4, in this example), no further splitting is permitted. When the binary tree node has width equal to MinBTSize (4, in this example), it implies no further horizontal splitting is permitted. Similarly, a binary tree node having a height equal to MinBTSize implies no further vertical splitting is permitted for that binary tree node. As noted above, leaf nodes of the binary tree are referred to as CUs and are further processed according to prediction and transform without further partitioning.

Trellis coded quantization (TCQ) was proposed in H. Schwarz, T. Nguyen, D. Marpe, T. Wiegand, M. Karczewicz, M. Coban, J. Dong, "CE7: Transform coefficient coding with reduced number of regular-coded bins (tests 7.1.3a, 7.1.3b)", JVET document JVET-L0274, Macao, CN, October 2018 (hereinafter JVET-L0274). In the techniques of JVET-L0274, two scalar quantizers are switchably used for quantization/dequantization. The scalar quantizer used on a current transform/quantized coefficient is determined by the parity (the least significant bit) of the quantized coefficient that precedes the current transform/quantized coefficient in the scanning order.

A transform coefficient coding scheme coupled with TCQ was also proposed in JVET-L0274, by which the context selection for decoding a quantized coefficient depends on the quantizer used. Specifically, the significance flag (SIG) of a transform coefficient indicating the transform coefficient is zero or non-zero may be coded with one of three sets of context models, and the set selected for a particular SIG depends on the quantizer used for the associated coefficient. Therefore, when starting to decode the SIG of a current coefficient, the entropy decoder (e.g., the entropy decoder of video decoder 300) determines the parity of the transform coefficient in the previous scanning position, which determines the quantizer for the current coefficient and thus the context set for that coefficient's SIG.

In some examples, a TU is divided into non-overlapped subblocks, called coding groups (CGs), of which the size is usually 4×4 samples. The decoding process described herein may at times be described with respect to a 4×4 CG but can be extended to any other CG sizes. The techniques of this disclosure, and hence the description included herein, primarily relate to the encoding and decoding processes for the absolute level of a transform coefficient in a CG. Other information associated with a CG, such as signs, may be encoded or decoded in the manner described in WET-L0274 but may also be encoded and decoded using alternate techniques.

Video encoder 200 and video decoder 300 may be configured to process syntax elements in bitstreams. For example, the following syntax elements may be used to represent an absolute level value (absLevel) for a transform coefficient. Note that quantized transform coeffects typically have an integer value. The absolute level is the magnitude of the transform coefficient.

sig_coeff_flag (SIG): This flag is equal to 0 if absLevel is 0; otherwise, the flag is equal to 1.

abs_level_gt1_flag: This flag is present in bitstream if sig_coeff_flag is equal to 1. The value of abs_level_gt1_flag is equal to 1 if absLevel is greater than 1; otherwise, abs_level_gt1_flag is equal to 0.

par_level_flag: This flag is present in bitstream if abs_level_gt1_flag is equal to 1. The value of the par_level_flag is equal to 0 if absLevel is an odd number, and is equal to 1, if absLevel is an even number.

abs_level_gt3_flag: This flag is present in bitstream if abs_level_gt1_flag is equal to 1. The value of the abs_level_gt3_flag is equal to 1 if absLevel is greater than 3; otherwise, the abs_level_gt3_flag is equal to 0.

abs_remainder: This syntax element is present in bitstream if abs_level_gt3_flag is equal to 1. The abs_remainder syntax element is the remaining absolute value of a transform coefficient level that is coded with Golomb-Rice code abs_level: This is the absolute value of a transform coefficient level that is coded with Golomb-Rice code.

Below, the syntax elements sig_coeff_flag, par_level_flag, abs_level_gt1_flag, abs_level_gt3_flag, abs_remainder, and abs_level are denoted as SIG, Par, Gt1, Gt2, remLevel, absLevel, respectively, for the simplicity of description.

Video encoder 200 and video decoder 300 may be configured to set any of the above syntax elements that are not parsed from bitstream to a default value, such as 0. Given the values of the first of the five syntax elements, a value for the absolute level of a transform coefficient can be calculated as:

$$absoluteLevel=SIG+Gt1+Par+(Gt2<<1)+(remLevel<<1) \qquad (1)$$

Alternatively, if the transform coefficient is coded entirely in bypass coded mode, then absoluteLevel may be directly coded as abs_level.

Figure 3:
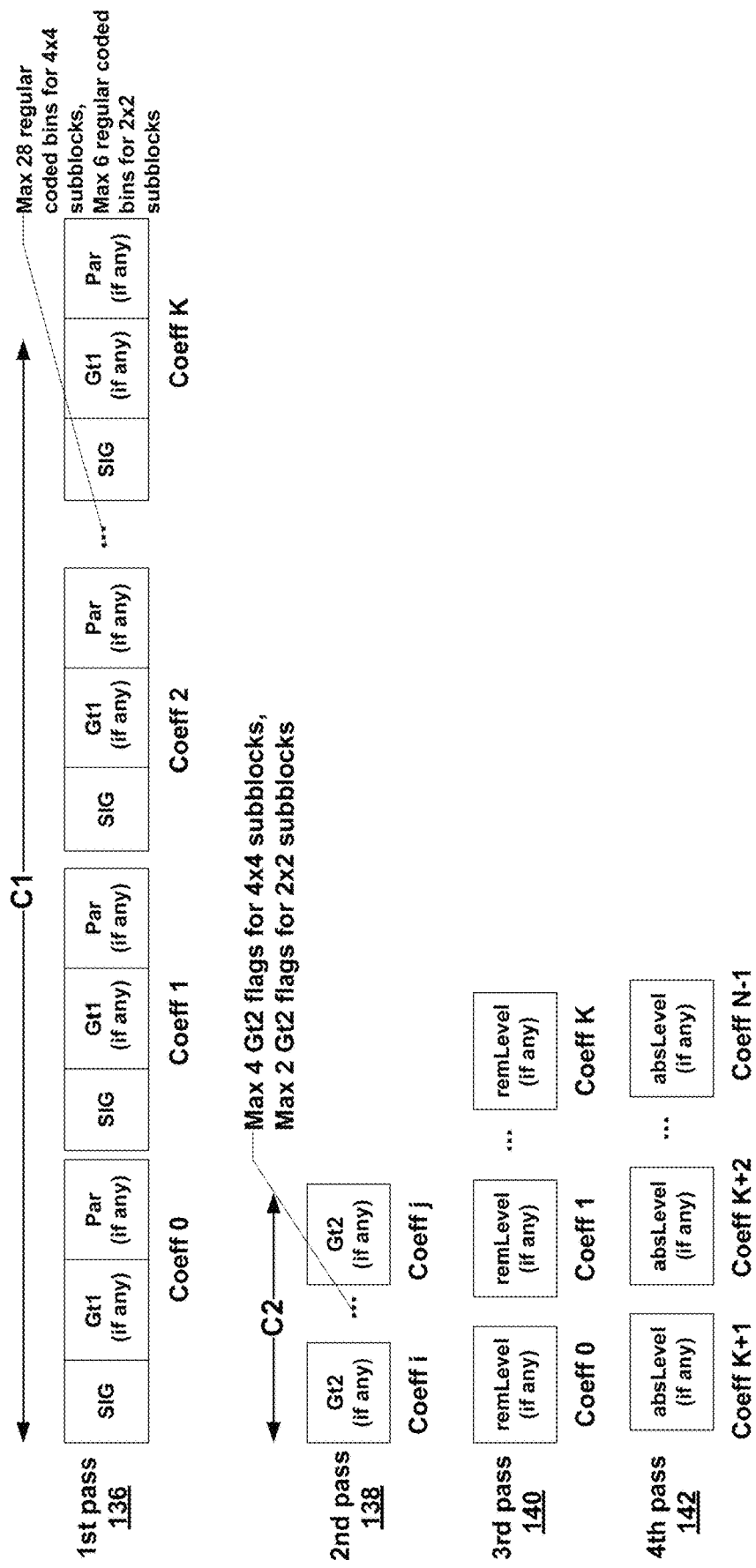
FIG. 3 shows an example order for the syntax elements representing absolute levels (absLevel) in a coding group (CG).

FIG. 3 shows an example order for the syntax elements representing absoluteLevels in a CG as in JVET-L0274. Other orders may also be used. As can be seen in FIG. 3, all the five syntax elements described above are parsed from bitstream, when absLevel is greater than 4.

In the example of FIG. 3, video decoder 300 scans the positions in a CG in up to four passes. In the first pass 136, video decoder 300 parses values for SIG, Par, and Gt1 syntax elements. Only non-zero SIGs are followed by the corresponding Gt1 and Par syntax elements. That is, if video decoder 300 determines that a SIG has a value of zero, meaning a transform coefficient level is equal to zero, then video decoder 300 does not receive instances of Gt1 and Par syntax elements for that coefficient. After the first pass 136, a value for the partial absoluteLevel, denoted as absLevel1, for each position may be reconstructed, as shown in equation (2).

$$absLevel1=SIG+Par+Gt1 \qquad (2)$$

In some implementations, video decoder 300 may be configured to parse a maximum of 28 regular coded bins in the first pass 136 for 4×4 subblocks and a maximum of 6 regular coded bins for 2×2 subblocks. The limits for the number of regular coded bins may be enforced in groups of SIG, Gt1, and Par bins, meaning that each group of SIG, Gt1, and Par bins is coded as a set and that switching to bypass coding in the middle of a set is not allowed. That is, in some implementations, every syntax element in an SIG, Gt1, and Par set is coded as regular coded bins (e.g., context coded) or is coded in bypass mode.

If there is at least one non-zero Gt1 in the first pass 136, then video decoder 300 may be configured to scan a second pass 138. In the second pass 138, video decoder 300 parses Gt2 syntax elements for the positions in the CG with non-zero Gt1 syntax elements. A position in a CG is associated with a transform coefficient. The bins in first pass 136 and second passes 138 may all be regular coded, meaning the probability distribution of the bin is modeled by a selected context model. If there is at least one non-zero Gt2 syntax element in the second pass 138, then video decoder 300 scans a third pass 140. During the third pass 140, video decoder 300 parses the remLevel syntax elements of the positions with non-zero Gt2s. A remLevel syntax element is not binary, and video decoder 300 may bypass code the bins of the binarized version of a remLevel, meaning the bins are assumed to be uniformly distributed and no context selection is needed.

In the fourth pass 142, video decoder 300 scans all remaining coefficients not represented partially with regular coded bins in the previous three passes. The transform coefficients levels of fourth pass 142 are coded as absolute values using bypass coded bins.

Video encoder 200 and video decoder 300 may perform context modelling to entropy code some of the syntax elements described above. The context modelling used in JVET-L0274 is also briefly introduced here, along with modifications proposed by this disclosure. Context modelling, discussed in more detail below, generally refers to the selection of probability models, also referred to as contexts, for a bin that is being encoded or decoded. In JVET-L0274, the syntax elements SIG, Par, Gt1, and Gt2 are coded using context modelling. The selection of a context depends on the values of absLevel1 syntax elements in a local neighborhood, denoted as N. Positions inside the template, but outside the current TU, may be excluded from N.

Figure 4:
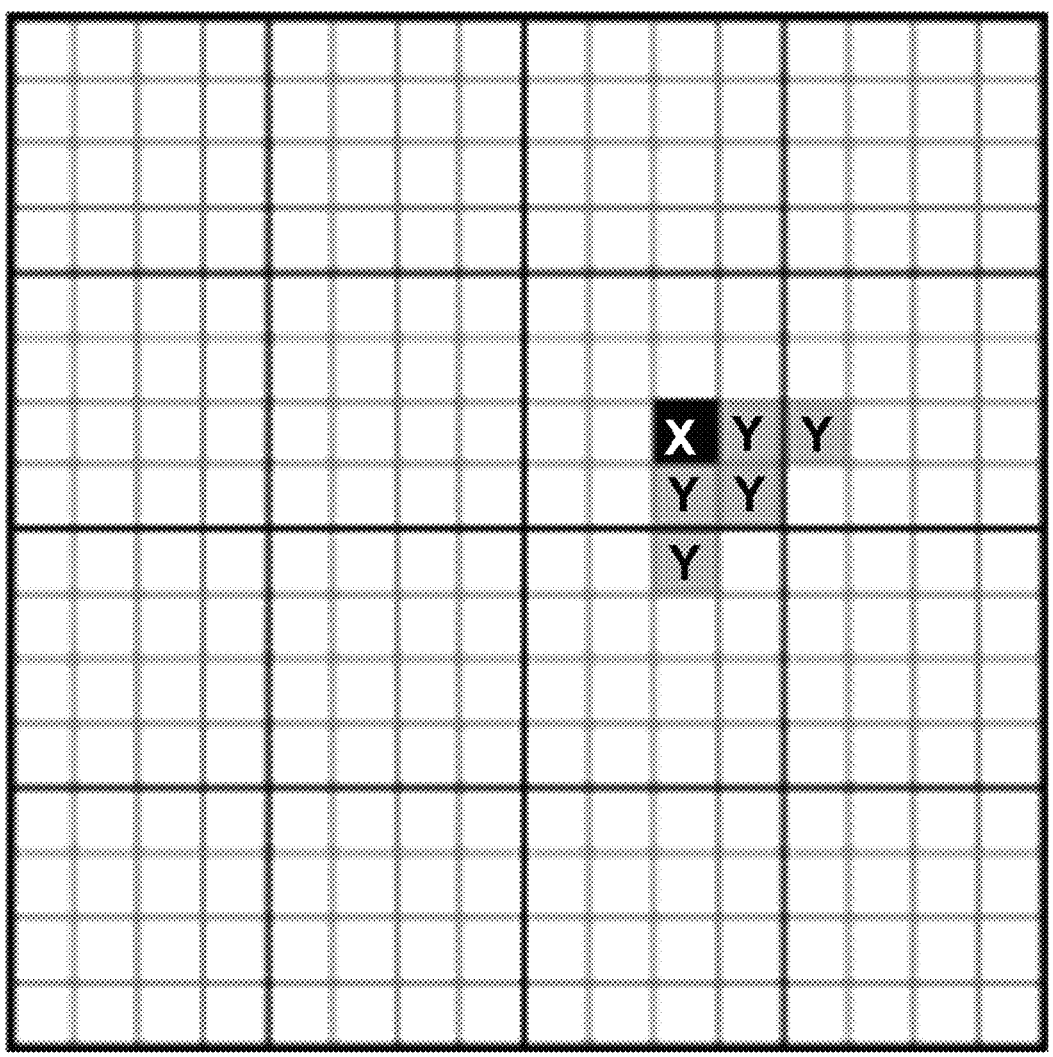
FIG. 4 shows an illustration of a template used for selecting probability models.

FIG. 4 shows an illustration of the template used for selecting probability models. The square marked with an "X" specifies the current scan position, and the squares marked with a "Y" represent the local neighborhood used.

For a current position (see the square with the X in FIG. 4), video decoder 300 determines context indices of for SIG, Par, Gt1, and Gt2 syntax elements, denoted as ctxIdxSIG, ctxIdxPar, ctxIdxGt1, and ctxIdxGt2. To determine the context indices, video decoder 300 may first determine three variables—numSIG, sumAbs1, and d. The variable numSIG represents the number of non-zero SIGs in N, which is expressed by equation (3) below:

$$sumSIG=\Sigma_{i \in N}SIG(i) \qquad (3)$$

The variable sumAbs1 represents the sum of absLevel1 in N, which is expressed by equation (4) below:

$$sumAbs1=\Sigma_{i \in N}absLevel1(i) \qquad (4)$$

The variable d represents the diagonal measure of the current position inside a TU, as expressed by equation (5) below:

$$d=x+y, \qquad (5)$$

where x and y represent the coordinates of the current position inside TU.

Given sumAbs1 and d, video decoder 300 determines the context index for decoding a SIG as follows:
For luma, ctxIdxSIG is determined by equation (6):

$$\text{ctxIdxSIG}=18*\max(0,\text{state}-1)+\min(\text{sumAbs1},5)+ (d<2?12:(d<5?6:0)) \quad (6)$$

For chroma, ctxIdxSIG is determined by equation (7):

$$\text{ctxIdxSIG}=12*\max(0,\text{state}-1)+\min(\text{sumAbs1},5)+ (d<2?6:0)) \quad (7)$$

In equations (6) and (7), the variable "state" represents the current state of the state machine, as defined in JVET-L0274. State machines are discussed in more detail below.

Given sumSIG, sumAbs1, and d, video decoder 300 determines the context index for decoding Par as follows:
If the current scan position is equal to the position of the last non-zero coefficient, ctxIdxPar is 0.
Otherwise,
For luma, ctxIdxPar is determined by equation (8):

$$\text{ctxIdxPar}=1+\min(\text{sumAbs1}-\text{numSIG},4)+(d?0:15: (d<3?10:(d<10?5:0))) \quad (8)$$

For chroma, ctxIdxPar is determined by (9)

$$\text{ctxIdxPar}=1+\min(\text{sumAbs1}-\text{numSIG},4)+(d==0?5:0) \quad (9)$$

ctxIdxGt1 and ctxIdxGt2 are set to the value of ctxIdxPar.

Video encoder 200 and video decoder 300 may be configured to perform RemLevel coding. Video decoder 300 derives the Rice Parameter (ricePar) for coding the non-binary syntax element remRemainder (remLevel) and absLevel as follows:
At the start of each subblock, ricePar is set equal to 0;
After coding a syntax element for the remainder, the Rice Parameter (ricePar) is modified as follows:
If ricePar is less than 3 and the last coded value of remainder is greater than $((3<<\text{ricePar})-1)$, ricePar is incremented by 1.
For coding the non-binary syntax element absLevel, representing the absolute quantization indexes that are completely bypass-coded, the following applies:
The sum of absolute values sumAbs in a local template is determined.
The variables ricePar and posZero are determined by a table look-up according to $$\text{ricePar}=\text{riceParTable}[\min(31,\text{sumAbs})]$$

$$\text{posZero}=\text{posZeroTable}[\max(0,\text{state}1)][\min(31,\text{sumAbs})]$$

where the variable state represent the state for dependent quantization (it is equal to 0 when dependent quantization is disabled) and the tables riceParTable[ ] and posZeroTable[ ][ ] are given by

--- riceParTable[32] = {
    0,0,0,0,0,0,0,1,1,1,1,1,1,2,2,2,2,2,2,2,2,2,2,2,2,2,2,3,3,3,3
};
posZeroTable[3][32] = {
    {0,0,0,0,0,1,2,2,2,2,2,4,4,4,4,4,4,4,4,4,4,4,8,8,8,8,8,8,8,8},
    {1,1,1,1,2,3,4,4,4,6,6,6,8,8,8,8,8,8,12,12,12,12,12,12,12,12,16,16,16,16,16,16},
    {1,1,2,2,2,3,4,4,4,6,6,6,8,8,8,8,8,8,12,12,12,12,12,12,12,12,16,16,16,16,16,16}
};

---

The intermediate variable codeValue is derived as follows:

If absLevel is equal to 0, codeValue is set equal to posZero;

Otherwise, if absLevel is less than or equal to posZero, codeValue is set equal to absLevel−1;
Otherwise (absLevel is greater than posZero), codeValue is set equal to absLevel.

The value of codeValue is coded using a Golomb-Rice code with Rice Parameter ricePar.

Video encoder 200 and video decoder 300 may be configured to perform a combination of Golomb-Rice coding and exponential Golomb coding for remaining level coding. That is, the portion of the transform coefficients levels that are not context coded may be represented by the combination of Golomb-Rice and exponential Golomb codes. The non-context coded portion of the transform coefficients may correspond to the values for remLevel or absLevel discussed above.

When coding level values for coefficients, it is generally expected that the non-context coded level values will be relatively small. Accordingly, this disclosure proposes using Golomb-Rice coding, which may be an efficient coding technique for coding small values. For those instances when a level value for a transform coefficient is not small, then exponential Golomb coding may be used, which can be an efficient coding technique for coding larger values.

The switching point for transitioning from Golomb-Rice to exponential Golomb coding for remaining coefficient values may be determined based on the following threshold:

$$\text{threshold}=\text{g\_auiGoRiceRange}[\text{m\_goRicePar m\_goRicePar}]<<\text{m\_goRicePar}.$$

Where m_goRicePar is the Rice parameter and g_auiGoRiceRange[MAX_GR_ORDER_RESIDUAL]= {6, 5, 6, 3}. is the look up table determining the prefix lengths (i.e. length−1) for each Rice Parameter. Coefficient values less than or equal to the threshold may be coded as Golomb-Rice codes, while coefficient values greater than the threshold may be coded using both Golomb-Rice codes and exponential Golomb codes.

Video decoder 300 may be configured to perform absoluteLevel reconstruction, which generally refers to the process of determining level values based on the various syntax elements. The absoluteLevel reconstruction is the same as in JVET-L0274, which was discussed above with respect to the syntax elements in the bitstream.

This disclosure describes techniques for remaining level coding. According to the techniques of this disclosure, video encoder 200 and video decoder 300 may be configured to use a fixed prefix length, defined by RiceRange for all Rice parameters, for determining the transitioning point between the use of Golomb-Rice and exponential Golomb codes. In one example, the threshold would be:

$$\text{threshold}=\text{RiceRange}<<\text{m\_goRicePar}.$$

A value of 5 or 6 for RiceRange may give good results in terms of coding performance in current VVC design. The techniques of this disclosure may, for example, eliminate the need to use look-up tables without unduly sacrificing coding efficiency.

In some examples, different RiceRange can be used for coding of remLevel and absLevel portion of the transform coefficients since remLevel represents half the remaining level where as absLevel represents the full level (larger values).

In other examples, video encoder 200 and video decoder 300 may be configured to use a fix RiceRange parameter, such as 5 or 6, for all Rice Parameters except the largest Rice Parameter, which could have smaller RiceRange parameter, such as 3.

The techniques of this disclosure include a proposed worst-case escape code length limitation. Current Golomb-Rice/exponential Golomb representations for remaining levels of coefficients can exceed 32 bits in length. For example, for worst case riceParam=0, the remLevel codes can have maximum value of 16381, which is represented in 33 bits. For absLevel, the maximum value of $2^{15}$ is represented in 35 bits. This disclosure proposes techniques to limit the worst-case code length to 32.

The maximum prefix code length is given by:

maximumPrefixLength=32−(RiceRange+MAX_TR_DYNAMIC_RANGE)

When this prefix length is reached, the corresponding suffix length is then given by:

suffixLength=MAX_TR_DYNAMIC_RANGE−rParam

This scheme limits the worst-case escape code length to 32 bits for coding of abs_remainder (remLevel) and dec_abs_level (absLevel) syntax elements.

The table below shows a proposed binarization cRiceParam=0.

| Input Value | Codeword prefix | Codeword suffix | Prefix code length | Suffix code length | Total codeword length |
| --- | --- | --- | --- | --- | --- |
| 0 | 0 | | 1 | 0 | 1 |
| 1 | 10 | | 2 | 0 | 2 |
| 2 | 110 | | 3 | 0 | 3 |
| 3 | 1110 | | 4 | 0 | 4 |
| 4 | 11110 | | 5 | 0 | 5 |
| 5 | 111110 | | 6 | 0 | 6 |
| [6, 7] | 1111110 | x | 7 | 1 | 8 |
| [8, 11] | 11111110 | xx | 8 | 2 | 10 |
| [12, 19] | 111111110 | xxx | 9 | 3 | 12 |
| [20, 35] | 1111111110 | xxxx | 10 | 4 | 14 |
| [36, 67] | 11111111110 | xxxxx | 11 | 5 | 16 |
| [68, 131] | 111111111110 | xxxxxx | 12 | 6 | 18 |
| [132, 259] | 1111111111110 | xxxxxxx | 13 | 7 | 20 |
| [260, 515] | 11111111111110 | xxxxxxxx | 14 | 8 | 22 |
| [516, 1027] | 111111111111110 | xxxxxxxxx | 15 | 9 | 24 |
| [1028, 2051] | 1111111111111110 | xxxxxxxxxx | 16 | 10 | 26 |
| [2052, 4099] | 11111111111111110 | xxxxxxxxxxx | 17 | 11 | 28 |
| [4100, 32768] | 11111111111111111 | xxx . . . 15 times | 17 | 15 | 32 |

In the table above, input value 5 represents the switching point between Golomb Rice coding and exponential Golomb coding. The codeword for input value may be viewed as a Golomb Rice code of 11111 appended by 0 which corresponds to 5+0. The next input, 6, may be viewed as the Golomb Rice code of 11111, appended by 10x, which corresponds to 5+1=6. The remaining inputs may similarly be viewed as a Golomb Rice code of 11111 plus an exponential Golomb value.

The table below generally shows the same coding scheme as above, but with a proposed binarization cRiceParam=1.

| Input Value | Codeword prefix | Codeword suffix | Prefix code length | Suffix code length | Total codeword length |
| --- | --- | --- | --- | --- | --- |
| [0, 1] | 0 | x | 1 | 1 | 2 |
| [2, 3] | 10 | x | 2 | 1 | 3 |
| [4, 5] | 110 | x | 3 | 1 | 4 |
| [6, 7] | 1110 | x | 4 | 1 | 5 |
| [8, 9] | 11110 | x | 5 | 1 | 6 |
| [10, 11] | 111110 | x | 6 | 1 | 7 |
| [12, 15] | 1111110 | xx | 7 | 2 | 9 |
| [16, 23] | 11111110 | xxx | 8 | 3 | 11 |
| [24, 39] | 111111110 | xxxx | 9 | 4 | 13 |
| [40, 71] | 1111111110 | xxxxx | 10 | 5 | 15 |
| [72, 135] | 11111111110 | xxxxxx | 11 | 6 | 17 |
| [136, 263] | 111111111110 | xxxxxxx | 12 | 7 | 19 |
| [264, 519] | 1111111111110 | xxxxxxxx | 13 | 8 | 21 |
| [520, 1031] | 11111111111110 | xxxxxxxxx | 14 | 9 | 23 |
| [1032, 2055] | 111111111111110 | xxxxxxxxxx | 15 | 10 | 25 |

-continued

| Input Value | Codeword prefix | Codeword suffix | Prefix code length | Suffix code length | Total codeword length |
|---|---|---|---|---|---|
| [2056, 4103] | 1111111111111110 | xxxxxxxxxxx | 16 | 11 | 27 |
| [4014, 8199] | 11111111111111110 | xxxxxxxxxxxx | 17 | 12 | 29 |
| [8200, 32768] | 11111111111111111 | xxx . . . 15 times | 17 | 15 | 32 |

The table below generally shows the same coding scheme as above, but with a proposed binarization cRiceParam=2.

| Input Value | Codeword prefix | Codeword suffix | Prefix code length | Suffix code length | Total codeword length |
|---|---|---|---|---|---|
| [0, 3] | 0 | xx | 1 | 2 | 3 |
| [4, 7] | 10 | xx | 2 | 2 | 4 |
| [8, 11] | 110 | xx | 3 | 2 | 5 |
| [12, 15] | 1110 | xx | 4 | 2 | 6 |
| [16, 19] | 11110 | xx | 5 | 2 | 7 |
| [20, 23] | 111110 | xx | 6 | 2 | 8 |
| [24, 31] | 1111110 | xxx | 7 | 3 | 10 |
| [32, 47] | 11111110 | xxxx | 8 | 4 | 12 |
| [48, 79] | 111111110 | xxxxx | 9 | 5 | 14 |
| [80, 143] | 1111111110 | xxxxxx | 10 | 6 | 16 |
| [144, 271] | 11111111110 | xxxxxxx | 11 | 7 | 18 |
| [272, 527] | 111111111110 | xxxxxxxx | 12 | 8 | 20 |
| [528, 1039] | 1111111111110 | xxxxxxxxx | 13 | 9 | 22 |
| [1040, 2063] | 11111111111110 | xxxxxxxxxx | 14 | 10 | 24 |
| [2064, 4111] | 111111111111110 | xxxxxxxxxxx | 15 | 11 | 26 |
| [4112, 8207] | 1111111111111110 | xxxxxxxxxxxx | 16 | 12 | 28 |
| [8028, 16399] | 11111111111111110 | xxxxxxxxxxxxx | 17 | 13 | 30 |
| [16400, 32768] | 11111111111111111 | xxx . . . 15 times | 17 | 15 | 32 |

The table below generally shows the same coding scheme as above, but with a proposed binarization cRiceParam=3.

| Input Value | Codeword prefix | Codeword suffix | Prefix code length | Suffix code length | Total codeword length |
|---|---|---|---|---|---|
| [0, 7] | 0 | xxx | 1 | 3 | 4 |
| [8, 15] | 10 | xxx | 2 | 3 | 5 |
| [16, 23] | 110 | xxx | 3 | 3 | 6 |
| [24, 31] | 1110 | xxx | 4 | 3 | 7 |
| [32, 39] | 11110 | xxx | 5 | 3 | 8 |
| [40, 47] | 111110 | xxx | 6 | 3 | 9 |
| [48, 63] | 1111110 | xxxx | 7 | 4 | 11 |
| [64, 95] | 11111110 | xxxxx | 8 | 5 | 13 |
| [96, 159] | 111111110 | xxxxxx | 9 | 6 | 15 |
| [160, 287] | 1111111110 | xxxxxxx | 10 | 7 | 17 |
| [288, 543] | 11111111110 | xxxxxxxx | 11 | 8 | 19 |
| [544, 1055] | 111111111110 | xxxxxxxxx | 12 | 9 | 21 |
| [1056, 2079] | 1111111111110 | xxxxxxxxxx | 13 | 10 | 23 |
| [2080, 4127] | 11111111111110 | xxxxxxxxxxx | 14 | 11 | 25 |
| [4128, 8223] | 111111111111110 | xxxxxxxxxxxx | 15 | 12 | 27 |
| [8224, 16415] | 1111111111111110 | xxxxxxxxxxxxx | 16 | 13 | 29 |
| [16416, 32768] | 11111111111111110 | xxxxxxxxxxxxxx | 17 | 14 | 31 |

Figure 5:
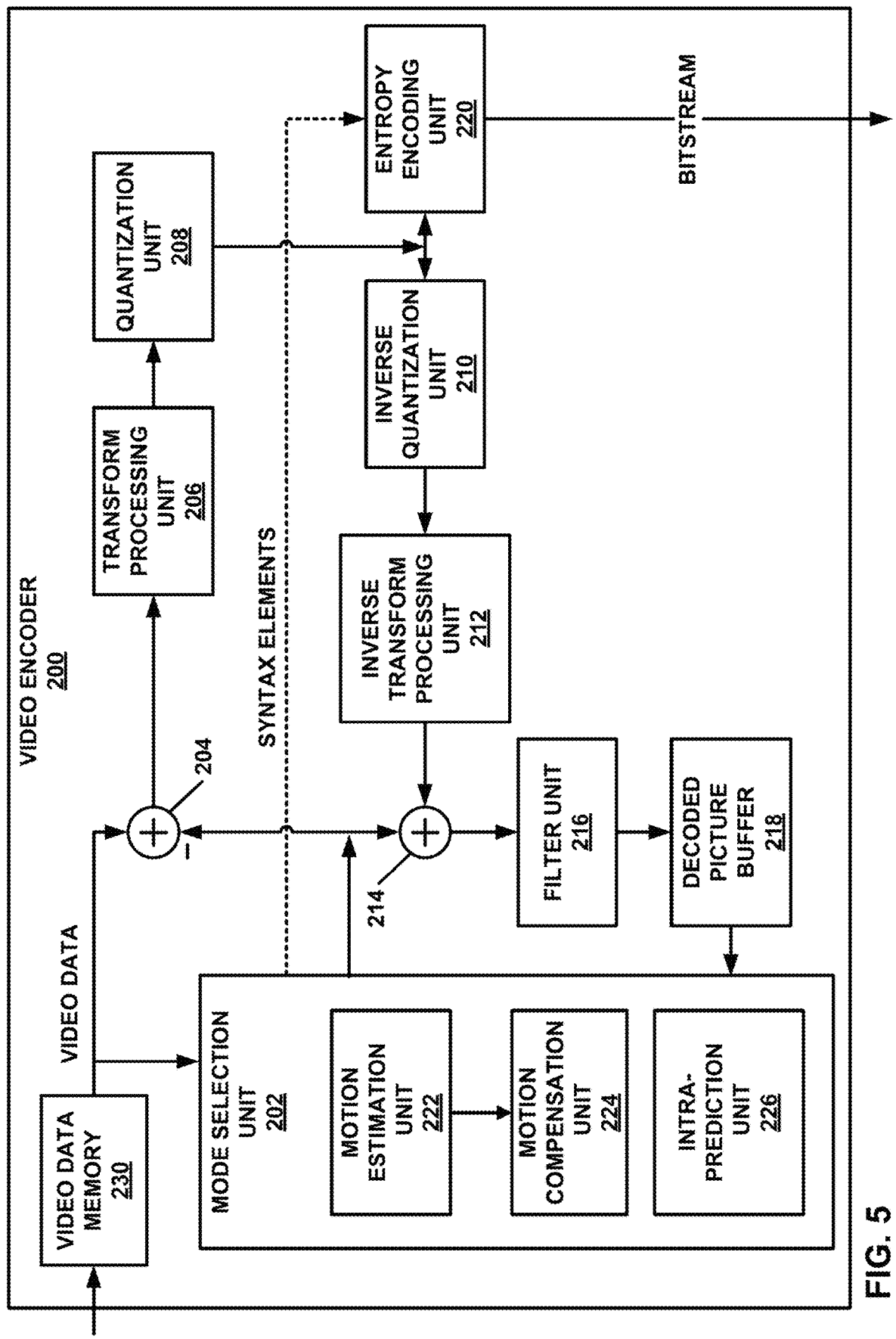
FIG. 5 is a block diagram illustrating an example video encoder that may perform the techniques of this disclosure.

FIG. 5 is a block diagram illustrating an example video encoder 200 that may perform the techniques of this disclosure. FIG. 5 is provided for purposes of explanation and should not be considered limiting of the techniques as broadly exemplified and described in this disclosure. For purposes of explanation, this disclosure describes video encoder 200 in the context of video coding standards such as the HEVC video coding standard and the H.266 video coding standard in development. However, the techniques of this disclosure are not limited to these video coding standards and are applicable generally to video encoding and decoding.

In the example of FIG. 5, video encoder 200 includes video data memory 230, mode selection unit 202, residual generation unit 204, transform processing unit 206, quantization unit 208, inverse quantization unit 210, inverse transform processing unit 212, reconstruction unit 214, filter unit 216, decoded picture buffer (DPB) 218, and entropy encoding unit 220.

Video data memory 230 may store video data to be encoded by the components of video encoder 200. Video encoder 200 may receive the video data stored in video data memory 230 from, for example, video source 104 (FIG. 1). DPB 218 may act as a reference picture memory that stores reference video data for use in prediction of subsequent video data by video encoder 200. Video data memory 230 and DPB 218 may be formed by any of a variety of memory devices, such as dynamic random access memory (DRAM), including synchronous DRAM (SDRAM), magnetoresistive RAM (MRAM), resistive RAM (RRAM), or other types of memory devices. Video data memory 230 and DPB 218 may be provided by the same memory device or separate memory devices. In various examples, video data memory 230 may be on-chip with other components of video encoder 200, as illustrated, or off-chip relative to those components.

In this disclosure, reference to video data memory 230 should not be interpreted as being limited to memory internal to video encoder 200, unless specifically described as such, or memory external to video encoder 200, unless specifically described as such. Rather, reference to video data memory 230 should be understood as reference memory that stores video data that video encoder 200 receives for encoding (e.g., video data for a current block that is to be encoded). Memory 106 of FIG. 1 may also provide temporary storage of outputs from the various units of video encoder 200.

The various units of FIG. 5 are illustrated to assist with understanding the operations performed by video encoder 200. The units may be implemented as fixed-function circuits, programmable circuits, or a combination thereof. Fixed-function circuits refer to circuits that provide particular functionality, and are preset on the operations that can be performed. Programmable circuits refer to circuits that can programmed to perform various tasks and provide flexible functionality in the operations that can be performed. For instance, programmable circuits may execute software or firmware that cause the programmable circuits to operate in the manner defined by instructions of the software or firmware. Fixed-function circuits may execute software instructions (e.g., to receive parameters or output parameters), but the types of operations that the fixed-function circuits perform are generally immutable. In some examples, the one or more of the units may be distinct circuit blocks (fixed-function or programmable), and in some examples, the one or more units may be integrated circuits.

Video encoder 200 may include arithmetic logic units (ALUs), elementary function units (EFUs), digital circuits, analog circuits, and/or programmable cores, formed from programmable circuits. In examples where the operations of video encoder 200 are performed using software executed by the programmable circuits, memory 106 (FIG. 1) may store the object code of the software that video encoder 200 receives and executes, or another memory within video encoder 200 (not shown) may store such instructions.

Video data memory 230 is configured to store received video data. Video encoder 200 may retrieve a picture of the video data from video data memory 230 and provide the video data to residual generation unit 204 and mode selection unit 202. Video data in video data memory 230 may be raw video data that is to be encoded.

Mode selection unit 202 includes a motion estimation unit 222, motion compensation unit 224, and an intra-prediction unit 226. Mode selection unit 202 may include additional functional units to perform video prediction in accordance with other prediction modes. As examples, mode selection unit 202 may include a palette unit, an intra-block copy unit (which may be part of motion estimation unit 222 and/or motion compensation unit 224), an affine unit, a linear model (LM) unit, or the like.

Mode selection unit 202 generally coordinates multiple encoding passes to test combinations of encoding parameters and resulting rate-distortion values for such combinations. The encoding parameters may include partitioning of CTUs into CUs, prediction modes for the CUs, transform types for residual data of the CUs, quantization parameters for residual data of the CUs, and so on. Mode selection unit 202 may ultimately select the combination of encoding parameters having rate-distortion values that are better than the other tested combinations.

Video encoder 200 may partition a picture retrieved from video data memory 230 into a series of CTUs and encapsulate one or more CTUs within a slice. Mode selection unit 202 may partition a CTU of the picture in accordance with a tree structure, such as the QTBT structure or the quad-tree structure of HEVC described above. As described above, video encoder 200 may form one or more CUs from partitioning a CTU according to the tree structure. Such a CU may also be referred to generally as a "video block" or "block."

In general, mode selection unit 202 also controls the components thereof (e.g., motion estimation unit 222, motion compensation unit 224, and intra-prediction unit 226) to generate a prediction block for a current block (e.g., a current CU, or in HEVC, the overlapping portion of a PU and a TU). For inter-prediction of a current block, motion estimation unit 222 may perform a motion search to identify one or more closely matching reference blocks in one or more reference pictures (e.g., one or more previously coded pictures stored in DPB 218). In particular, motion estimation unit 222 may calculate a value representative of how similar a potential reference block is to the current block, e.g., according to sum of absolute difference (SAD), sum of squared differences (SSD), mean absolute difference (MAD), mean squared differences (MSD), or the like. Motion estimation unit 222 may generally perform these calculations using sample-by-sample differences between the current block and the reference block being considered. Motion estimation unit 222 may identify a reference block having a lowest value resulting from these calculations, indicating a reference block that most closely matches the current block.

Motion estimation unit 222 may form one or more motion vectors (MVs) that defines the positions of the reference blocks in the reference pictures relative to the position of the current block in a current picture. Motion estimation unit 222 may then provide the motion vectors to motion compensation unit 224. For example, for uni-directional inter-prediction, motion estimation unit 222 may provide a single motion vector, whereas for bi-directional inter-prediction, motion estimation unit 222 may provide two motion vectors. Motion compensation unit 224 may then generate a prediction block using the motion vectors. For example, motion compensation unit 224 may retrieve data of the reference block using the motion vector. As another example, if the motion vector has fractional sample precision, motion compensation unit 224 may interpolate values for the prediction block according to one or more interpolation filters. Moreover, for bi-directional inter-prediction, motion compensation unit 224 may retrieve data for two reference blocks identified by respective motion vectors and combine the retrieved data, e.g., through sample-by-sample averaging or weighted averaging.

As another example, for intra-prediction, or intra-prediction coding, intra-prediction unit 226 may generate the prediction block from samples neighboring the current block. For example, for directional modes, intra-prediction unit 226 may generally mathematically combine values of neighboring samples and populate these calculated values in the defined direction across the current block to produce the prediction block. As another example, for DC mode, intra-prediction unit 226 may calculate an average of the neighboring samples to the current block and generate the prediction block to include this resulting average for each sample of the prediction block.

Mode selection unit 202 provides the prediction block to residual generation unit 204. Residual generation unit 204 receives a raw, uncoded version of the current block from video data memory 230 and the prediction block from mode selection unit 202. Residual generation unit 204 calculates sample-by-sample differences between the current block and the prediction block. The resulting sample-by-sample differences define a residual block for the current block. In some examples, residual generation unit 204 may also determine differences between sample values in the residual block to generate a residual block using residual differential pulse code modulation (RDPCM). In some examples, residual generation unit 204 may be formed using one or more subtractor circuits that perform binary subtraction.

In examples where mode selection unit 202 partitions CUs into PUs, each PU may be associated with a luma prediction unit and corresponding chroma prediction units. Video encoder 200 and video decoder 300 may support PUs having various sizes. As indicated above, the size of a CU may refer to the size of the luma coding block of the CU and the size of a PU may refer to the size of a luma prediction unit of the PU. Assuming that the size of a particular CU is 2N×2N, video encoder 200 may support PU sizes of 2N×2N or N×N for intra prediction, and symmetric PU sizes of 2N×2N, 2N×N, N×2N, N×N, or similar for inter prediction. Video encoder 200 and video decoder 30 may also support asymmetric partitioning for PU sizes of 2N×nU, 2N×nD, nL×2N, and nR×2N for inter prediction.

In examples where mode selection unit does not further partition a CU into PUs, each CU may be associated with a luma coding block and corresponding chroma coding blocks. As above, the size of a CU may refer to the size of the luma coding block of the CU. The video encoder 200 and video decoder 120 may support CU sizes of 2N×2N, 2N×N, or N×2N.

For other video coding techniques such as an intra-block copy mode coding, an affine-mode coding, and linear model (LM) mode coding, as few examples, mode selection unit 202, via respective units associated with the coding techniques, generates a prediction block for the current block being encoded. In some examples, such as palette mode coding, mode selection unit 202 may not generate a prediction block, and instead generate syntax elements that indicate the manner in which to reconstruct the block based on a selected palette. In such modes, mode selection unit 202 may provide these syntax elements to entropy encoding unit 220 to be encoded.

As described above, residual generation unit 204 receives the video data for the current block and the corresponding prediction block. Residual generation unit 204 then generates a residual block for the current block. To generate the residual block, residual generation unit 204 calculates sample-by-sample differences between the prediction block and the current block.

Transform processing unit 206 applies one or more transforms to the residual block to generate a block of transform coefficients (referred to herein as a "transform coefficient block"). Transform processing unit 206 may apply various transforms to a residual block to form the transform coefficient block. For example, transform processing unit 206 may apply a discrete cosine transform (DCT), a directional transform, a Karhunen-Loeve transform (KLT), or a conceptually similar transform to a residual block. In some examples, transform processing unit 206 may perform multiple transforms to a residual block, e.g., a primary transform and a secondary transform, such as a rotational transform. In some examples, transform processing unit 206 does not apply transforms to a residual block.

Quantization unit 208 may quantize the transform coefficients in a transform coefficient block, to produce a quantized transform coefficient block. Quantization unit 208 may quantize transform coefficients of a transform coefficient block according to a quantization parameter (QP) value associated with the current block. Video encoder 200 (e.g., via mode selection unit 202) may adjust the degree of quantization applied to the transform coefficient blocks associated with the current block by adjusting the QP value associated with the CU. Quantization may introduce loss of information, and thus, quantized transform coefficients may have lower precision than the original transform coefficients produced by transform processing unit 206.

Inverse quantization unit 210 and inverse transform processing unit 212 may apply inverse quantization and inverse transforms to a quantized transform coefficient block, respectively, to reconstruct a residual block from the transform coefficient block. Reconstruction unit 214 may produce a reconstructed block corresponding to the current block (albeit potentially with some degree of distortion) based on the reconstructed residual block and a prediction block generated by mode selection unit 202. For example, reconstruction unit 214 may add samples of the reconstructed residual block to corresponding samples from the prediction block generated by mode selection unit 202 to produce the reconstructed block.

Filter unit 216 may perform one or more filter operations on reconstructed blocks. For example, filter unit 216 may perform deblocking operations to reduce blockiness artifacts along edges of CUs. Operations of filter unit 216 may be skipped, in some examples.

Video encoder 200 stores reconstructed blocks in DPB 218. For instance, in examples where operations of filter unit 216 are skipped, i.e., filtering is not performed, reconstruction unit 214 may store reconstructed blocks to DPB 218. In examples where operations of filter unit 216 are performed, filter unit 216 may store the filtered reconstructed blocks to DPB 218. Motion estimation unit 222 and motion compensation unit 224 may retrieve a reference picture from DPB 218, formed from the reconstructed (and potentially filtered) blocks, to inter-predict blocks of subsequently encoded pictures. In addition, intra-prediction unit 226 may use reconstructed blocks in DPB 218 of a current picture to intra-predict other blocks in the current picture.

In general, entropy encoding unit 220 may entropy encode syntax elements received from other functional components of video encoder 200, including the syntax elements described above for coefficient coding. Entropy encoding unit 220 may, for example, entropy encode the syntax elements discussed above for signaling transform coefficients. For example, entropy encoding unit 220 may entropy encode quantized transform coefficient blocks from quantization unit 208. As another example, entropy encoding unit 220 may entropy encode prediction syntax elements (e.g., motion information for inter-prediction or intra-mode information for intra-prediction) from mode selection unit 202. Entropy encoding unit 220 may perform one or more entropy encoding operations on the syntax elements, which are another example of video data, to generate entropy-encoded data. For example, entropy encoding unit 220 may perform a context-adaptive variable length coding (CAVLC) operation, a CABAC operation, a variable-to-variable (V2V) length coding operation, a syntax-based context-adaptive binary arithmetic coding (SBAC) operation, a Probability Interval Partitioning Entropy (PIPE) coding operation, an Exponential-Golomb encoding operation, or another type of entropy encoding operation on the data. In some examples, entropy encoding unit 220 may operate in bypass mode where syntax elements are not entropy encoded.

Video encoder 200 may output a bitstream that includes the entropy encoded syntax elements needed to reconstruct blocks of a slice or picture. In particular, entropy encoding unit 220 may output the bitstream.

The operations described above are described with respect to a block. Such description should be understood as being operations for a luma coding block and/or chroma coding blocks. As described above, in some examples, the luma coding block and chroma coding blocks are luma and chroma components of a CU. In some examples, the luma coding block and the chroma coding blocks are luma and chroma components of a PU.

In some examples, operations performed with respect to a luma coding block need not be repeated for the chroma coding blocks. As one example, operations to identify a motion vector (MV) and reference picture for a luma coding block need not be repeated for identifying a MV and reference picture for the chroma blocks. Rather, the MV for the luma coding block may be scaled to determine the MV for the chroma blocks, and the reference picture may be the same. As another example, the intra-prediction process may be the same for the luma coding blocks and the chroma coding blocks.

Video encoder 200 represents an example of a device configured to encode video data including a memory configured to store video data, and one or more processing units implemented in circuitry and configured to encode coefficients as described in this disclosure.

Video encoder 200 may, for example, perform a first encoding pass for first syntax elements of a transform coefficient group, wherein the first syntax elements correspond to a first set of coefficients in the transform coefficient group; perform an additional encoding pass for additional syntax elements of the transform coefficient group, wherein the additional syntax elements comprise at least one syntax element indicating a remaining level of a transform coefficient of the first set of coefficients; process the at least one syntax element indicating the remaining level of the transform coefficient in accordance with any technique in this disclosure. The first syntax elements may, for example, include one or more significance flags, with each of the one or more significance flags indicating if an absolute level for a transform coefficient is equal to zero. The first syntax elements may include one or more parity level flags, with each of the one or more parity level flags indicating if a transform coefficient has an absolute level that is even or odd. Video encoder 200 may also perform a second encoding pass for second syntax elements of the transform coefficient group before performing the additional encoding pass.

Video encoder 200 also represents an example of a device configured to encode video data including a memory configured to store video data, and one or more processing units implemented in circuitry and configured to determine values for coefficients of a transform coefficient group and context encodes syntax elements for a first set of coefficients of the transform coefficient group until a maximum number of regular coded bins is reached. The context encoded syntax elements include one or more significance flags indicating if an absolute level for a transform coefficient is equal to zero, one or more parity level flags indicating if a transform coefficient has an absolute level that is even or odd, and one or more first flags indicating if a transform coefficient has an absolute level that is greater than 2. To context encode the syntax elements of the transform coefficient group, video encoder 200 may be configured to perform context-adaptive binary arithmetic encoding to encode the syntax elements of the transform coefficient group.

Video encoder 200 may be configured to bypass encode additional syntax elements for a second set of coefficients of the transform coefficient group in response to reaching the maximum number of regular coded bins. To bypass encode the additional syntax elements, video encoder 200 determines a level value for a transform coefficient of the second set of coefficients, encodes a prefix value for the transform coefficient using Golomb-Rice coding in response to the level value being greater than a threshold value, and in response to the level value being greater than the threshold value, encodes a suffix value using exponential Golomb coding. Video encoder 200 may, for example, determine the suffix value by subtracting the prefix value from the level value for the transform coefficient. The level value for the transform coefficient may be either an absolute level value or a remaining level value.

To bypass encode the additional syntax elements, video encoder 200 may also be configured to determine a second level value for a second coefficient of the second set of coefficients and in response to the second level value being less than the threshold value, encode a prefix value for the second coefficient using Golomb-Rice coding without encoding a suffix value for the second coefficient. The threshold value may be a fixed value for all coefficients or a value that changes. For example, video encoder 200 may, for example, be configured to determine a value for a Rice parameter for the transform coefficient and determine the threshold value based on the value for the Rice parameter. The threshold value may, for example, be 5 or 6, although other values may also be used.

Figure 6:
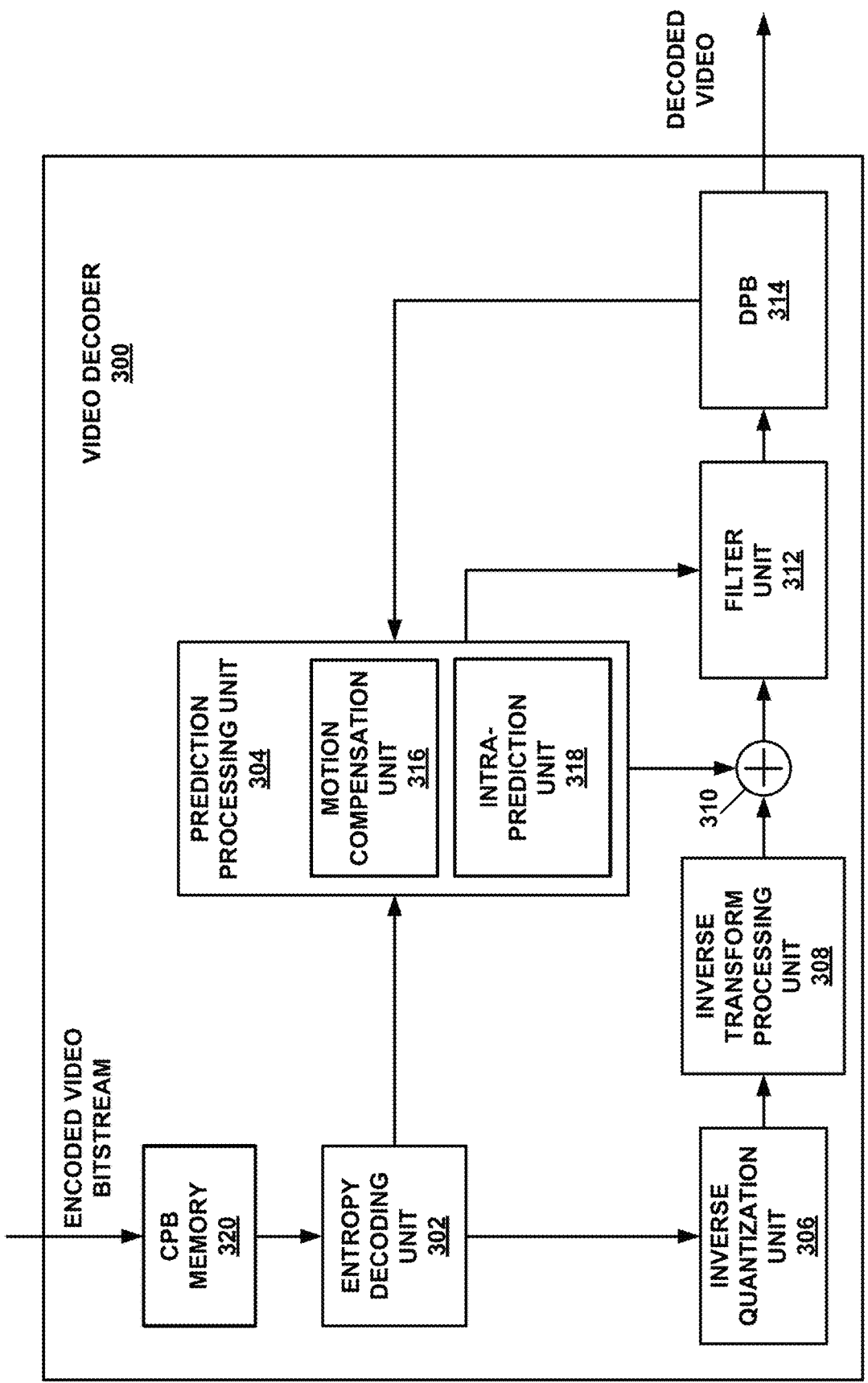
FIG. 6 is a block diagram illustrating an example video decoder that may perform the techniques of this disclosure.

FIG. 6 is a block diagram illustrating an example video decoder 300 that may perform the techniques of this disclosure. FIG. 6 is provided for purposes of explanation and is not limiting on the techniques as broadly exemplified and described in this disclosure. For purposes of explanation, this disclosure describes video decoder 300 is described according to the techniques of JEM and HEVC. However, the techniques of this disclosure may be performed by video coding devices that are configured to other video coding standards.

In the example of FIG. 6, video decoder 300 includes coded picture buffer (CPB) memory 320, entropy decoding unit 302, prediction processing unit 304, inverse quantization unit 306, inverse transform processing unit 308, reconstruction unit 310, filter unit 312, and decoded picture buffer (DPB) 314. Prediction processing unit 304 includes motion compensation unit 316 and intra-prediction unit 318. Prediction processing unit 304 may include addition units to perform prediction in accordance with other prediction modes. As examples, prediction processing unit 304 may include a palette unit, an intra-block copy unit (which may form part of motion compensation unit 316), an affine unit, a linear model (LM) unit, or the like. In other examples, video decoder 300 may include more, fewer, or different functional components.

CPB memory 320 may store video data, such as an encoded video bitstream, to be decoded by the components of video decoder 300. The video data stored in CPB memory 320 may be obtained, for example, from computer-readable medium 110 (FIG. 1). CPB memory 320 may include a CPB that stores encoded video data (e.g., syntax elements) from an encoded video bitstream. Also, CPB memory 320 may store video data other than syntax elements of a coded picture, such as temporary data representing outputs from the various units of video decoder 300. DPB 314 generally stores decoded pictures, which video decoder 300 may output and/or use as reference video data when decoding subsequent data or pictures of the encoded video bitstream. CPB memory 320 and DPB 314 may be formed by any of a variety of memory devices, such as dynamic random access memory (DRAM), including synchronous DRAM (SDRAM), magnetoresistive RAM (MRAM), resistive RAM (RRAM), or other types of memory devices. CPB memory 320 and DPB 314 may be provided by the same memory device or separate memory devices. In various examples, CPB memory 320 may be on-chip with other components of video decoder 300, or off-chip relative to those components.

Additionally or alternatively, in some examples, video decoder 300 may retrieve coded video data from memory 120 (FIG. 1). That is, memory 120 may store data as discussed above with CPB memory 320. Likewise, memory 120 may store instructions to be executed by video decoder 300, when some or all of the functionality of video decoder 300 is implemented in software to executed by processing circuitry of video decoder 300.

The various units shown in FIG. 6 are illustrated to assist with understanding the operations performed by video decoder 300. The units may be implemented as fixed-function circuits, programmable circuits, or a combination thereof. Similar to FIG. 5, fixed-function circuits refer to circuits that provide particular functionality and are preset on the operations that can be performed. Programmable circuits refer to circuits that can programmed to perform various tasks, and provide flexible functionality in the operations that can be performed. For instance, programmable circuits may execute software or firmware that cause the programmable circuits to operate in the manner defined by instructions of the software or firmware. Fixed-function circuits may execute software instructions (e.g., to receive parameters or output parameters), but the types of operations that the fixed-function circuits perform are generally immutable. In some examples, the one or more of the units may be distinct circuit blocks (fixed-function or programmable), and in some examples, the one or more units may be integrated circuits.

Video decoder 300 may include ALUs, EFUs, digital circuits, analog circuits, and/or programmable cores formed from programmable circuits. In examples where the operations of video decoder 300 are performed by software executing on the programmable circuits, on-chip or off-chip memory may store instructions (e.g., object code) of the software that video decoder 300 receives and executes.

Entropy decoding unit 302 may receive encoded video data from the CPB and entropy decode the video data to reproduce syntax elements, including the syntax elements described above for coefficient coding. Prediction processing unit 304, inverse quantization unit 306, inverse transform processing unit 308, reconstruction unit 310, and filter unit 312 may generate decoded video data based on the syntax elements extracted from the bitstream.

In general, video decoder 300 reconstructs a picture on a block-by-block basis. Video decoder 300 may perform a reconstruction operation on each block individually (where the block currently being reconstructed, i.e., decoded, may be referred to as a "current block").

Entropy decoding unit 302 may entropy decode syntax elements defining quantized transform coefficients of a quantized transform coefficient block, as well as transform information, such as a quantization parameter (QP) and/or transform mode indication(s). Entropy decoding unit 302 may, for example, entropy decode the syntax elements discussed above for signaling transform coefficients. Inverse quantization unit 306 may use the QP associated with the quantized transform coefficient block to determine a degree of quantization and, likewise, a degree of inverse quantization for inverse quantization unit 306 to apply. Inverse quantization unit 306 may, for example, perform a bitwise left-shift operation to inverse quantize the quantized transform coefficients. Inverse quantization unit 306 may thereby form a transform coefficient block including transform coefficients.

After inverse quantization unit 306 forms the transform coefficient block, inverse transform processing unit 308 may apply one or more inverse transforms to the transform coefficient block to generate a residual block associated with the current block. For example, inverse transform processing unit 308 may apply an inverse DCT, an inverse integer transform, an inverse Karhunen-Loeve transform (KLT), an inverse rotational transform, an inverse directional transform, or another inverse transform to the transform coefficient block.

Furthermore, prediction processing unit 304 generates a prediction block according to prediction information syntax elements that were entropy decoded by entropy decoding unit 302. For example, if the prediction information syntax elements indicate that the current block is inter-predicted, motion compensation unit 316 may generate the prediction block. In this case, the prediction information syntax elements may indicate a reference picture in DPB 314 from which to retrieve a reference block, as well as a motion vector identifying a location of the reference block in the reference picture relative to the location of the current block in the current picture. Motion compensation unit 316 may generally perform the inter-prediction process in a manner that is substantially similar to that described with respect to motion compensation unit 224 (FIG. 5).

As another example, if the prediction information syntax elements indicate that the current block is intra-predicted, intra-prediction unit 318 may generate the prediction block according to an intra-prediction mode indicated by the prediction information syntax elements. Again, intra-prediction unit 318 may generally perform the intra-prediction process in a manner that is substantially similar to that described with respect to intra-prediction unit 226 (FIG. 5). Intra-prediction unit 318 may retrieve data of neighboring samples to the current block from DPB 314.

Reconstruction unit 310 may reconstruct the current block using the prediction block and the residual block. For example, reconstruction unit 310 may add samples of the residual block to corresponding samples of the prediction block to reconstruct the current block.

Filter unit 312 may perform one or more filter operations on reconstructed blocks. For example, filter unit 312 may perform deblocking operations to reduce blockiness artifacts along edges of the reconstructed blocks. Operations of filter unit 312 are not necessarily performed in all examples.

Video decoder 300 may store the reconstructed blocks in DPB 314. As discussed above, DPB 314 may provide reference information, such as samples of a current picture for intra-prediction and previously decoded pictures for subsequent motion compensation, to prediction processing unit 304. Moreover, video decoder 300 may output decoded pictures from DPB for subsequent presentation on a display device, such as display device 118 of FIG. 1.

In this manner, video decoder 300 represents an example of a video decoding device including a memory configured to store video data, and one or more processing units implemented in circuitry and configured to decode coefficients as described in this disclosure.

Video decoder 300 may, for example, perform a first decoding pass for first syntax elements of a transform coefficient group, wherein the first syntax elements correspond to a first set of coefficients in the transform coefficient group; perform an additional decoding pass for additional syntax elements of the transform coefficient group, wherein the additional syntax elements comprise at least one syntax element indicating a remaining level of a transform coefficient of the first set of coefficients; and process the at least one syntax element indicating the remaining level of the transform coefficient in accordance with any technique in this disclosure. Video decoder 300 may determine the value of the transform coefficient based on the first syntax elements and the additional syntax elements.

The first syntax elements may, for example, include one or more significance flags, wherein each of the one or more significance flags indicate if an absolute level for a transform coefficient is equal to zero. The first syntax elements may, for example, include one or more parity level flags, with each of the one or more parity level flags indicating if a transform coefficient has an absolute level that is even or odd. Video decoder 300 may also performing a second decoding pass for second syntax elements of the transform coefficient group before performing the additional decoding pass.

In this manner, video decoder 300 also represents an example of a video decoding device including a memory configured to store video data, and one or more processing units implemented in circuitry and configured to context decode syntax elements for a first set of coefficients of a transform coefficient group until a maximum number of regular coded bins is reached. The context encoded syntax elements include one or more significance flags indicating if an absolute level for a transform coefficient is equal to zero, one or more parity level flags indicating if a transform coefficient has an absolute level that is even or odd, and one or more first flags indicating if a transform coefficient has an absolute level that is greater than 2. To context decode the syntax elements of the transform coefficient group, video decoder may be configured to perform context-adaptive binary arithmetic decoding to decode the syntax elements of the transform coefficient group.

Video decoder 300 may be configured to bypass decode additional syntax elements for a second set of coefficients in response to reaching the maximum number of regular coded bins. To bypass decode the additional syntax elements, video decoder 300 may be configured to receive a prefix value for a transform coefficient, decode the prefix value using Golomb-Rice coding, receive a suffix value for the transform coefficient in response to a length of the prefix value being equal to a threshold value, and decode the suffix value using exponential Golomb coding.

Video decoder 300 may be configured to determine values for the first set of coefficients of the transform unit based on the context decoded syntax elements and determine values for the second set of coefficients of the transform unit based on the additional syntax elements. To determine the values for the second set of coefficients of the transform unit based on the additional syntax elements, video decoder 300 may be configured to determine a level value for the transform coefficient based on the decoded prefix value and the decoded suffix value. To determine the level value for the transform coefficient, video decoder 300 may be configured to add the decoded prefix value to the decoded suffix value. The level value for the transform coefficient may be either an absolute level value or a remaining level value.

For a second coefficient, video decoder 300 may be configured to receive a second prefix value for a second coefficient; decode the second prefix value using Golomb-Rice coding; in response to a length of the second prefix value being less than the threshold value, determine a level value for the second coefficient without receiving a suffix value for the second coefficient.

The threshold value may be a fixed value for all coefficients or a value that changes. For example, video decoder 300 may, for example, be configured to determine a value for a Rice parameter for the transform coefficient and determine the threshold value based on the value for the Rice parameter. The threshold value may, for example, be 5 or 6, although other values may also be used.

Video decoder may be configured to determine a decoded transform block based on the values for the first set of coefficients and the values for the second set of coefficients; add the decoded transform block to a prediction block to determine a reconstructed block; perform one or more filtering operations on the reconstructed block to determine a decoded block of video data; and output a decoded picture of video data that includes the decoded block of video data.

Figure 7A:
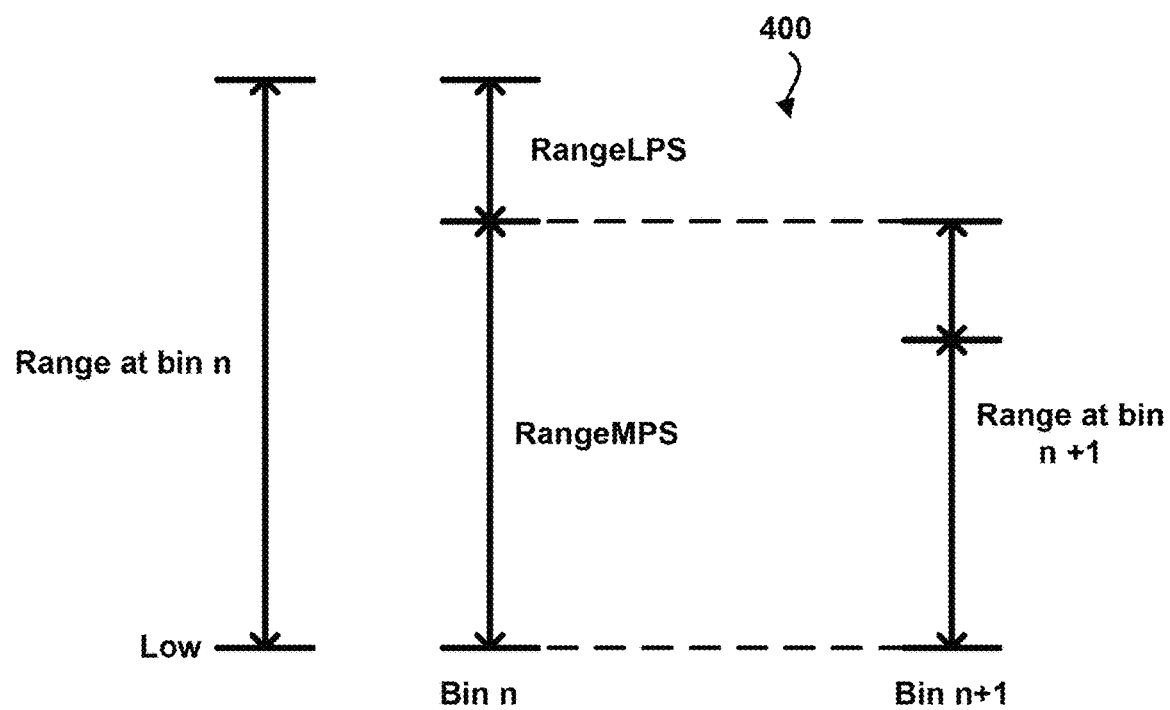
FIGS. 7A and 7B are conceptual diagrams illustrating a range update process in binary arithmetic coding.
Figure 7B:
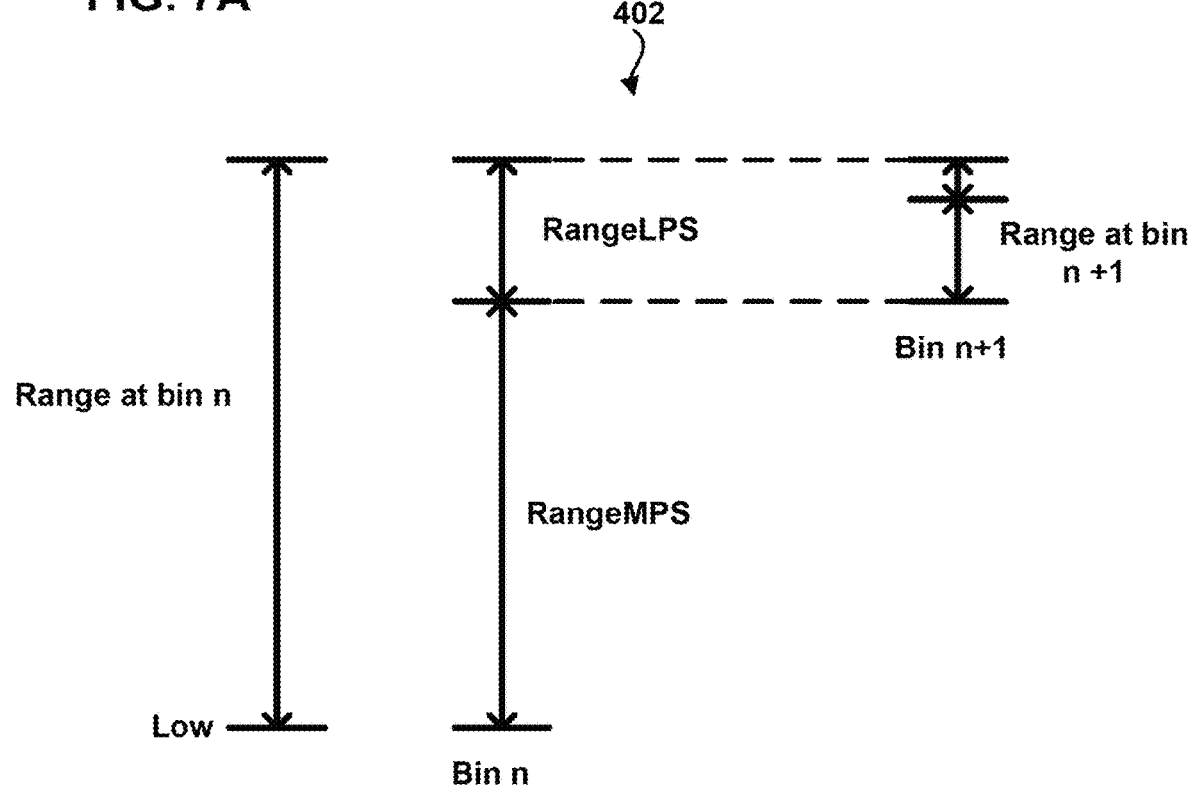

FIGS. 7A and 7B show examples of a CABAC process at a bin n. In example 400 of FIG. 7A, at bin n the range at bin 2 includes the RangeMPS and RangeLPS given by the probability of the least probable symbol (LPS) ($p_o$) given a certain context state ($\sigma$). Example 400 shows the update of the range at bin n+1 when the value of bin n is equal to the most probable symbol (MPS). In this example, the low stays the same, but the value of the range at bin n+1 is reduced to the value of RangeMPS at bin n. Example 402 of FIG. 7B shows the update of the range at bin n+1 when the value of bin n is not equal to the MPS (i.e., equal to the LPS). In this example, the low is moved to the lower range value of RangeLPS at bin n. In addition, the value of the range at bin n+1 is reduced to the value of RangeLPS at bin n.

Figure 8:
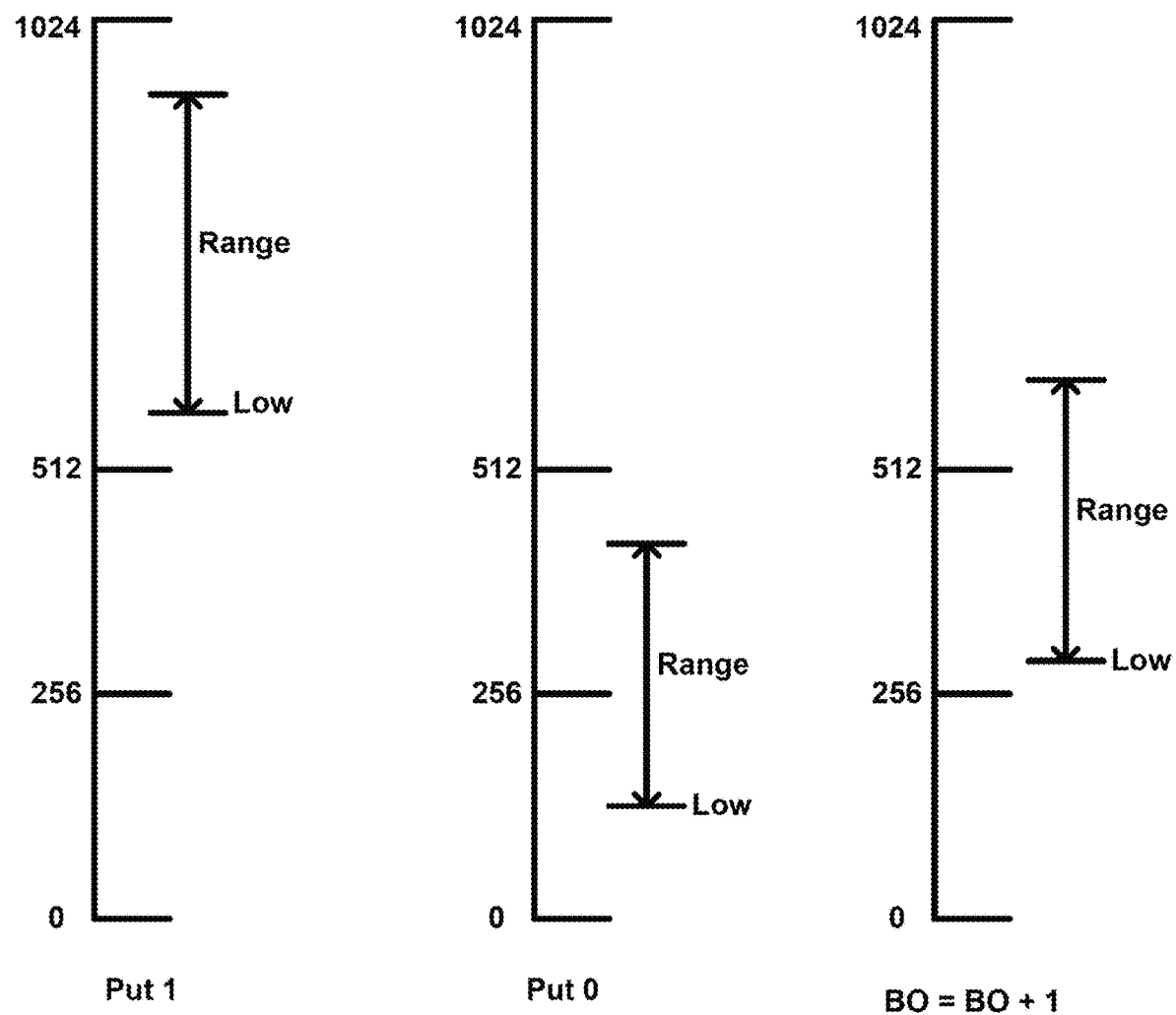
FIG. 8 is a conceptual diagram illustrating an output process in binary arithmetic coding.

In one example of the HEVC video coding process, range is expressed with 9 bits and the low with 10 bits. There is a renormalization process to maintain the range and low values at sufficient precision. The renormalization occurs whenever the range is less than 256. Therefore, the range is always equal or larger than 256 after renormalization. Depending on the values of range and low, the binary arithmetic coder (BAC) outputs to the bitstream, a '0,' or a '1,' or updates an internal variable (called BO: bits-outstanding) to keep for future outputs. FIG. 8 shows examples of BAC output depending on the range. For example, a '1' is output to the bitstream when the range and low are above a certain threshold (e.g., 512). A '0' is output to the bitstream when the range and low are below a certain threshold (e.g., 512). Nothing is output to the bitstream when the range and lower are between certain thresholds. Instead, the BO value is incremented and the next bin is encoded.

In the CABAC context model of H.264/AVC and in some examples of HEVC, there are 128 states. There are 64 possible LPS probabilities (denoted by state σ) that can be from 0 to 63. Each MPS can be zero or one. As such, the 128 states are 64 state probabilities times the 2 possible values for MPS (0 or 1). Therefore, the state can be indexed with 7 bits.

To reduce the computation of deriving LPS ranges (rangeLPS$_\sigma$), results for all cases may be pre-calculated and stored as approximations in a look-up table. Therefore, the LPS range can be obtained without any multiplication by using a simple table lookup. Avoiding multiplication can be important for some devices or applications, since this operation may cause significant latency in many hardware architectures.

A 4-column pre-calculated LPS range table may be used instead of the multiplication. The range is divided into four segments. The segment index can be derived by the question (range>>6)&3. In effect, the segment index is derived by shifting and dropping bits from the actual range. The following Table 1 shows the possible ranges and their corresponding indexes.

TABLE 1

| Range Index | | | | |
|---|---|---|---|---|
| Range | 256-319 | 320-383 | 384-447 | 448-511 |
| (range >> 6) & 3 | 0 | 1 | 2 | 3 |

The LPS range table has then 64 entries (one for each probability state) times 4 (one for each range index). Each entry is the Range LPS, that is, the value of multiplying the range times the LPS probability. An example of part of this table is shown in the following Table 2. Table 2 depicts probability states 9-12. In one proposal for HEVC, the probability states may range from 0-63.

TABLE 2

| | RangeLPS | | | |
|---|---|---|---|---|
| | RangeLPS | | | |
| Prob State (σ) | Index 0 | Index 1 | Index 2 | Index 3 |
| ... | ... | ... | ... | ... |
| 9 | 90 | 110 | 130 | 150 |
| 10 | 85 | 104 | 123 | 142 |
| 11 | 81 | 99 | 117 | 135 |
| 12 | 77 | 94 | 111 | 128 |
| ... | ... | ... | ... | ... |

In each segment (i.e., range value), the LPS range of each probability state, is pre-defined. In other words, the LPS range of a probability state, is quantized into four values (i.e., one value for each range index). The specific LPS range used at a given point depends on which segment the range belongs to. The number of possible LPS ranges used in the table is a trade-off between the number of table columns (i.e., the number of possible LPS range values) and the LPS range precision. Generally speaking, more columns results in smaller quantization errors of LPS range values, but also increases the need for more memory to store the table. Fewer columns increases quantization errors, but also reduces the memory needed to store the table.

As described above, each LPS probability state has a corresponding probability. The probability p for each state is derived as follows:

$p_\sigma = \alpha p_{\sigma-1}$ where the state σ is from 0 to 63. The constant α represents the amount of probability change between each context state. In one example, α=0.9493, or, more precisely, α=(0.01875/0.5)$^{1/63}$. The probability at state σ=0 is equal to 0.5 (i.e., p$_0$=½). That is, at context state 0, the LPS and MPS are equally probable. The probability at each successive state is derived by multiplying the previous state by a. As such, the probability of the LPS occurring at context state α=1 is p$_0$*0.9493 (0.5*0.9493=0.47465). As such, as the index of state σ increases, the probability of the LPS occurring goes down.

CABAC is adaptive because the probability states are updated in order to follow the signal statistics (i.e., the values of previously coded bins). The update process is as follows. For a given probability state, the update depends on the state index and the value of the encoded symbol identified either as an LPS or an MPS. As a result of the updating process, a new probability state is derived, which consists of a potentially modified LPS probability estimate and, if necessary, a modified MPS value.

In the event of a bin value equaling the MPS, a given state index may be incremented by 1. This is for all states except when an MPS occurs at state index 62, where the LPS probability is already at its minimum (or equivalently, the maximum MPS probability is reached). In this case, the state index 62 remains fixed until an LPS is seen, or the last bin value is encoded (state 63 is used for the special case of the last bin value). When an LPS occurs, the state index is changed by decrementing the state index by a certain amount, as shown in the equation below. This rule applies in general to each occurrence of a LPS with the following exception. Assuming a LPS has been encoded at the state with index σ=0, which corresponds to the equi-probable case, the state index remains fixed, but the MPS value will be toggled such that the value of the LPS and MPS will be interchanged. In all other cases, no matter which symbol has been encoded, the MPS value will not be altered. The derivation of the transition rules for the LPS probability is based on the following relation between a given LPS probability $p_{old}$ and its updated counterpart $p_{new}$:

| | |
|---|---|
| $p_{new} = \max(\alpha\, p_{old}, p_{62})$ | if a MPS occurs |
| $p_{new} = (1 - \alpha) + \alpha\, p_{old}$ | if a LPS occurs |

With regard to a practical implementation of the probability estimation process in CABAC, it is important to note that all transition rules may be realized by at most two tables each having 63 entries of 6-bit unsigned integer values. In some examples, state transitions may be determined with a single table TransIdxLPS, which determines, for a given state index σ, the new updated state index TransIdxLPS [σ] in case an LPS has been observed. The MPS-driven transitions can be obtained by a simple (saturated) increment of the state index by the fixed value of 1, resulting in an updated state index min(σ+1, 62). Table 3 below is an example of a partial TransIdxLPS table.

TABLE 3

TransIdxLPS

| Prob State (σ) | New State TransIdxLPS [σ] |
|---|---|
| ... | ... |
| 9 | 6 |
| 10 | 8 |
| 11 | 8 |
| 12 | 8 |
| ... | ... |

The techniques described above with respect to FIGS. 7A, 7B, and 8 merely represent one example implementation of CABAC. It should be understood that the techniques of this disclosure are not limited only to this described implementation of CABAC. For example, in older BAC approaches (e.g., the BAC approach used in H.264/AVC), the tables RangeLPS and TransIdxLPS were tuned for low resolution videos, (i.e., common intermediate format (CIF) and quarter-CIF (QCIF) videos). With HEVC and future codecs such as VVC, a large amount of video content is high definition (HD) and, in some cases, greater than HD. Video content that is HD or greater than HD resolution tends to have different statistics than the 10-year-old QCIF sequences used to develop H.264/AVC. As such, the tables RangeLPS and TransIdxLPS from H.264/AVC may cause adaptation between states in a manner that is too quick. That is, the transitions between probability states, especially when an LPS occurs, can be too great for the smoother, higher resolution content of HD video. Thus, the probability models used according to conventional techniques may not be as accurate for HD and extra-HD content. In addition, as HD video content includes a greater range of pixel values, the H.264/AVC tables do not include enough entries to account for the more extreme values that may be present in HD content.

As such, for HEVC and for future coding standards such as VVC, the RangeLPS and TransIdxLPS tables may be modified to account for the characteristics of this new content. In particular, the BAC processes for HEVC and future coding standards may use tables that allow for a slower adaptation process and may account for more extreme cases (i.e., skewed probabilities). Thus, as one example, the RangeLPS and TransIdxLPS tables may be modified to achieve these goals by including more probability states and ranges than used in BAC with H.264/AVC or HEVC.

Figure 9:
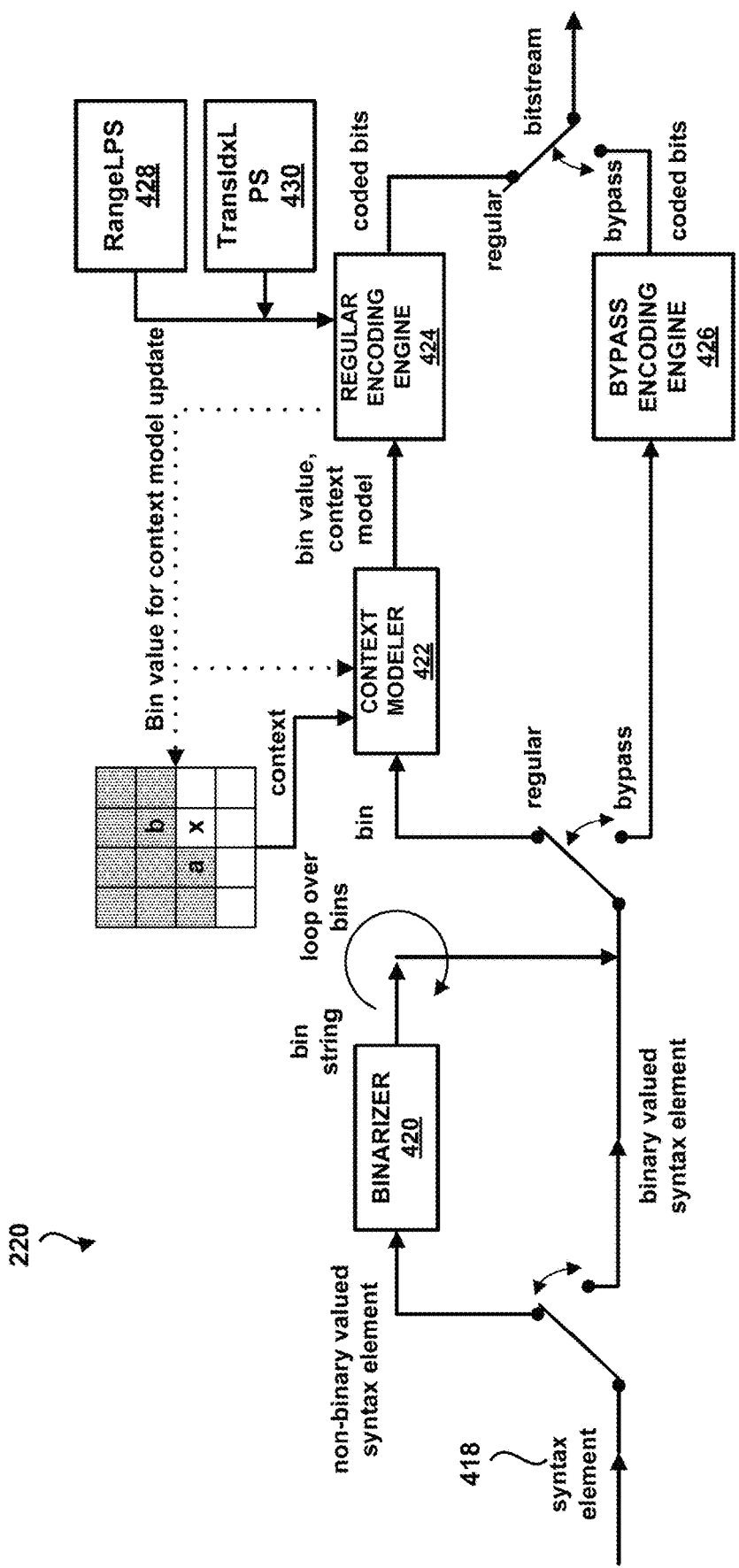
FIG. 9 is a block diagram illustrating a context adaptive binary arithmetic coding (CABAC) coder in a video encoder.

FIG. 9 is a block diagram of an example entropy encoding unit 220 that may be configured to perform CABAC in accordance with the techniques of this disclosure. A syntax element 418 is input into the entropy encoding unit 220. If the syntax element is already a binary-value syntax element (i.e., a syntax element that only has a value of 0 and 1), the step of binarization may be skipped. If the syntax element is a non-binary valued syntax element (e.g., a syntax element represented by multiple bits, such as transform coefficient levels), the non-binary valued syntax element is binarized by binarizer 420. Binarizer 420 performs a mapping of the non-binary valued syntax element into a sequence of binary decisions. These binary decisions are often called "bins." For example, for transform coefficient levels, the value of the level may be broken down into successive bins, each bin indicating whether or not the absolute value of coefficient level is greater than some value. For example, bin 0 (sometimes called a significance flag) indicates if the absolute value of the transform coefficient level is greater than 0 or not. Bin 1 indicates if the absolute value of the transform coefficient level is greater than 1 or not, and so on. A unique mapping may be developed for each non-binary valued syntax element.

Each bin produced by binarizer 420 is fed to the binary arithmetic coding side of entropy encoding unit 220. That is, for a predetermined set of non-binary valued syntax elements, each bin type (e.g., bin 0) is coded before the next bin type (e.g., bin 1). Coding may be performed in either regular mode or bypass mode. In bypass mode, bypass coding engine 426 performs arithmetic coding using a fixed probability model, for example, using Golomb-Rice or exponential Golomb coding. Bypass mode is generally used for more predictable syntax elements.

Coding in regular mode involves performing CABAC. Regular mode CABAC is for coding bin values where the probability of a value of a bin is predictable given the values of previously coded bins. The probability of a bin being an LPS is determined by context modeler 422. Context modeler 422 outputs the bin value and the context model (e.g., the probability state σ). The context model may be an initial context model for a series of bins, or may be determined based on the coded values of previously coded bins. As described above, the context modeler may update the state based on whether or not the previously-coded bin was an MPS or an LPS.

After the context model and probability state σ are determined by context modeler 422, regular coding engine 424 performs BAC on the bin value. According to the techniques of this disclosure, regular coding engine 424 performs BAC using TransIdxLPS table 430 that includes more than 64 probability states σ. In one example, the number of probability states is 128. TransIdxLPS is used to determine which probability state is used for a next bin (bin n+1) when the previous bin (bin n) is an LPS. Regular coding engine 424 may also use a RangeLPS table 128 to determine the range value for an LPS given a particular probability state σ. However, according to the techniques of this disclosure, rather than using all possible probability states σ of the TransIdxLPS table 430, the probability state indexes σ are mapped to grouped indexes for use in the RangeLPS table. That is, each index into the RangeLPS table 428 may represent two or more of the total number of probability states. The mapping of probability state index σ to grouped indexes may be linear (e.g., by dividing by two), or may be non-linear (e.g., a logarithmic function or mapping table).

In other examples of the disclosure, the difference between successive probability states may be made smaller by setting the parameter a to be greater than 0.9493. In one example, $\alpha=0.9689$. In another example of the disclosure, the highest probability ($p_0$) of an LPS occurring may be set to be lower than 0.5. In one example, $p_0$ may be equal to 0.493.

In accordance with one or more techniques of this disclosure, as opposed to using the same value of a variable used to update a probability state in a binary arithmetic coding process (e.g., one or more of a window size, a scaling factor ($\alpha$), and a probability updating speed), entropy encoding unit 220 may use different values of the variable for different context models and/or different syntax elements. For instance, entropy encoding unit 220 may determine, for a context model of a plurality of context models, a value of a variable used to update a probability state in a binary arithmetic coding process and update the probability state based on the determined value.

Figure 10:
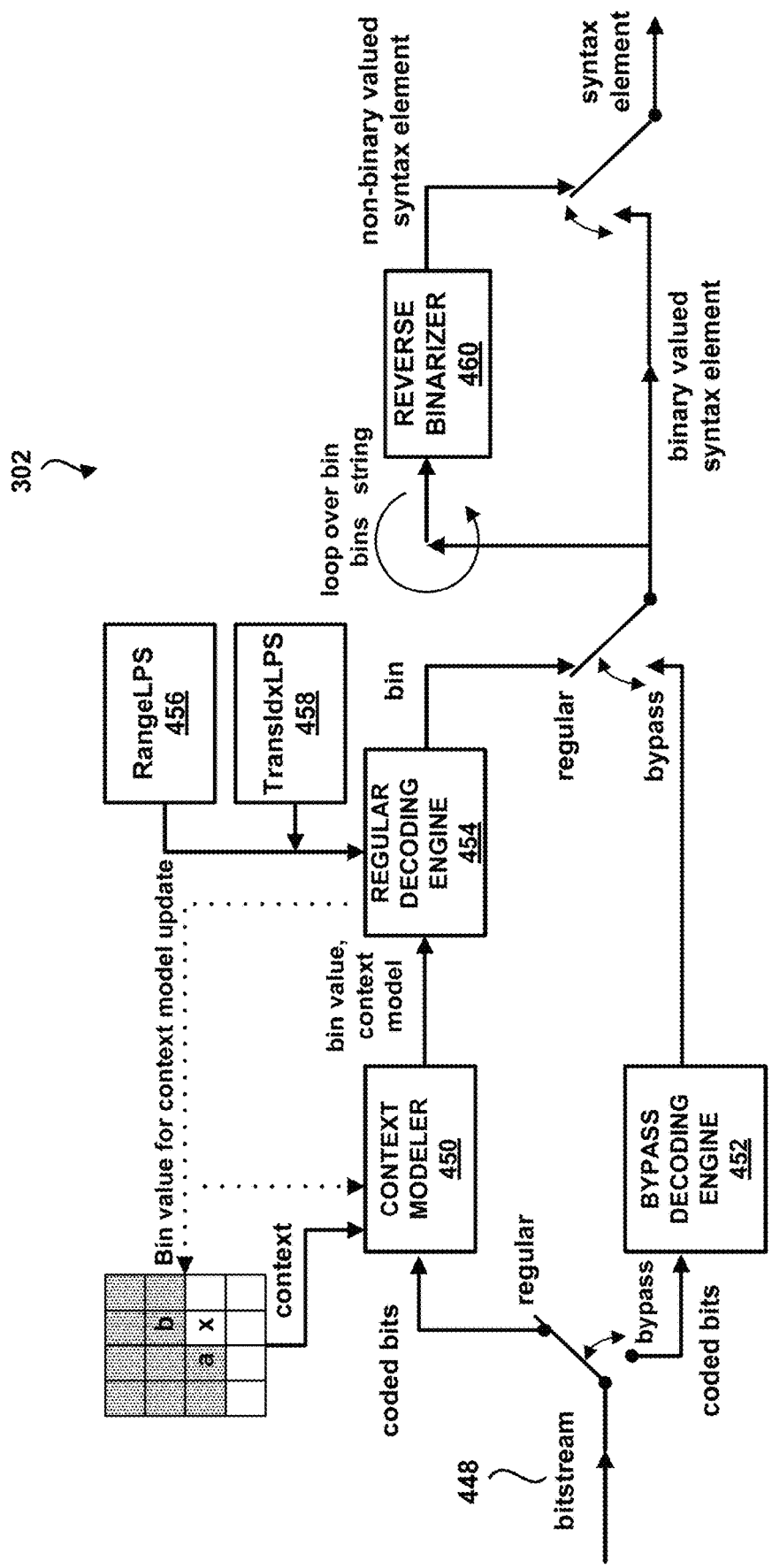
FIG. 10 is a block diagram illustrating a CABAC coder in a video decoder.

FIG. 10 is a block diagram of an example entropy decoding unit 302 that may be configured to perform CABAC in accordance with the techniques of this disclosure. The entropy decoding unit 302 of FIG. 10 performs CABAC in an inverse manner as that of entropy encoding unit 220 described in FIG. 9. Coded bits from bitstream 448 are input into entropy decoding unit 302. The coded bits are fed to either context modeler 450 or bypass decoding engine 452 based on whether or not the coded bits were entropy coded using bypass mode or regular mode. If the coded bits were coded in bypass mode, bypass decoding engine 452 may, for example, use Golomb-Rice or exponential Golomb decoding to retrieve the binary-valued syntax elements or bins of non-binary syntax elements.

If the coded bits were coded in regular mode, context modeler 450 may determine a probability model for the coded bits and regular decoding engine 454 may decode the coded bits to produce bins of non-binary valued syntax elements (or the syntax elements themselves if binary-valued). After the context model and probability state σ is determined by context modeler 450, regular decoding engine 454 performs BAC on the bin value. According to the techniques of this disclosure, regular decoding engine 454 performs BAC using TransIdxLPS table 458 that includes more than 64 probability states σ. In one example, the number of probability states is 128, although other numbers of probability states could be defined, consistent with the techniques of this disclosure. TransIdxLPS table 458 is used to determine which probability state is used for a next bin (bin n+1) when the previous bin (bin n) is an LPS. Regular decoding engine 454 may also use a RangeLPS table 456 to determine the range value for an LPS given a particular probability state σ. However, according to the techniques of this disclosure, rather than using all possible probability states σ of the TransIdxLPS table 458, the probability state indexes σ are mapped to grouped indexes for use in RangeLPS table 456. That is, each index into RangeLPS table 456 may represent two or more of the total number of probability states. The mapping of probability state index σ to grouped indexes may be linear (e.g., by dividing by two), or may be non-linear (e.g., a logarithmic function or mapping table).

In other examples of the disclosure, the difference between successive probability states may be made smaller by setting the parameter a to be greater than 0.9493. In one example, $\alpha=0.9689$. In another example of the disclosure, the highest probability ($p_0$) of an LPS occurring may be set to be lower than 0.5. In one example, $p_0$ may be equal to 0.493.

After the bins are decoded by regular decoding engine 454, a reverse binarizer 460 may perform a reverse mapping to convert the bins back into the values of the non-binary valued syntax elements.

Figure 11:
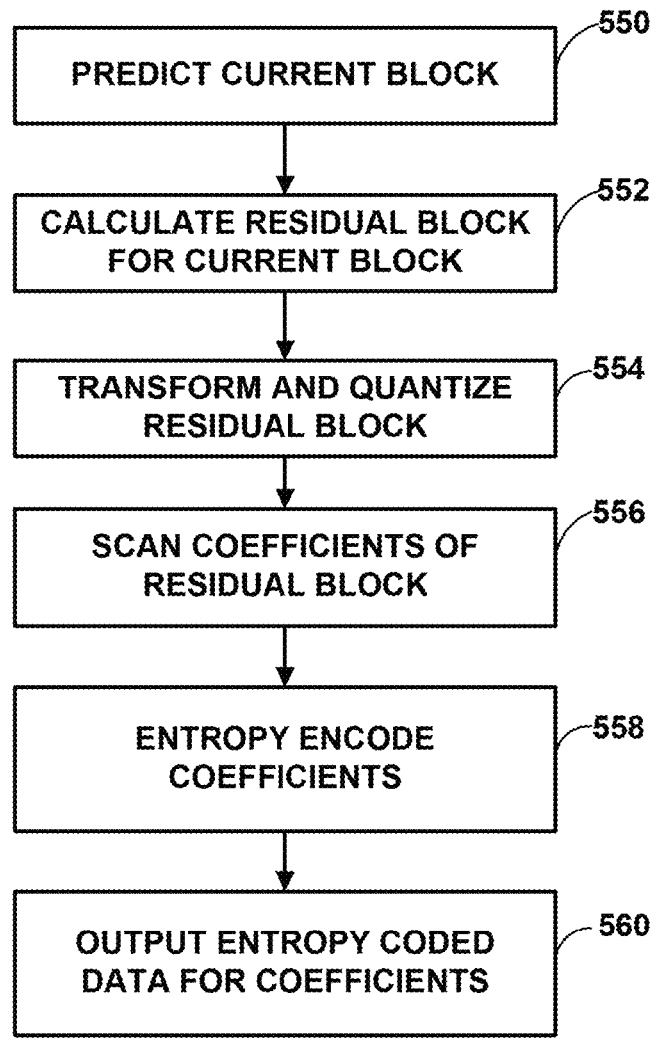
FIG. 11 is a flowchart illustrating an example operation of a video encoder.

FIG. 11 is a flowchart illustrating an example operation of a video encoder for encoding a current block of video data. The current block may include a current CU. Although described with respect to video encoder 200 (FIGS. 1 and 5), it should be understood that other devices may be configured to perform an operation similar to that of FIG. 11.

In this example, video encoder 200 initially predicts the current block (550). For example, video encoder 200 may form a prediction block for the current block. Video encoder 200 may then calculate a residual block for the current block (552). To calculate the residual block, video encoder 200 may calculate a difference between the original, uncoded block and the prediction block for the current block. Video encoder 200 may then transform and quantize coefficients of the residual block (554). Next, video encoder 200 may scan the quantized transform coefficients of the residual block (556). During the scan, or following the scan, video encoder 200 may entropy encode the transform coefficients (558). For example, video encoder 200 may encode the transform coefficients using CAVLC or CABAC. Video encoder 200 may then output the entropy coded data of the block (560).

Figure 12:
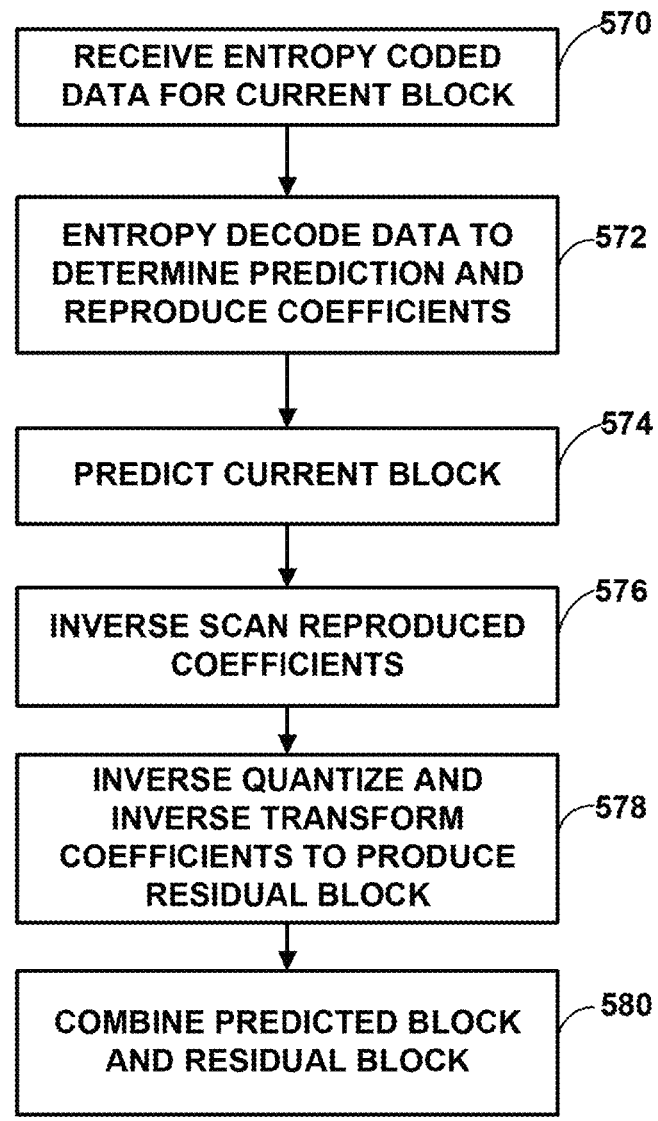
FIG. 12 is a flowchart illustrating an example operation of a video decoder.

FIG. 12 is a flowchart illustrating an example operation of a video decoder for decoding a current block of video data. The current block may include a current CU. Although described with respect to video decoder 300 (FIGS. 1 and 6), it should be understood that other devices may be configured to perform an operation similar to that of FIG. 12.

Video decoder 300 may receive entropy coded data for the current block, such as entropy coded prediction information and entropy coded data for coefficients of a residual block corresponding to the current block (570). Video decoder 300 may entropy decode the entropy coded data to determine prediction information for the current block and to reproduce coefficients of the residual block (572). Video decoder 300 may predict the current block (574), e.g., using an intra- or inter-prediction mode as indicated by the prediction information for the current block, to calculate a prediction block for the current block. Video decoder 300 may then inverse scan the reproduced coefficients (576), to create a block of quantized transform coefficients. Video decoder 300 may then inverse quantize and inverse transform the transform coefficients to produce a residual block (578). Video decoder 300 may ultimately decode the current block by combining the prediction block and the residual block (580).

Figure 13:
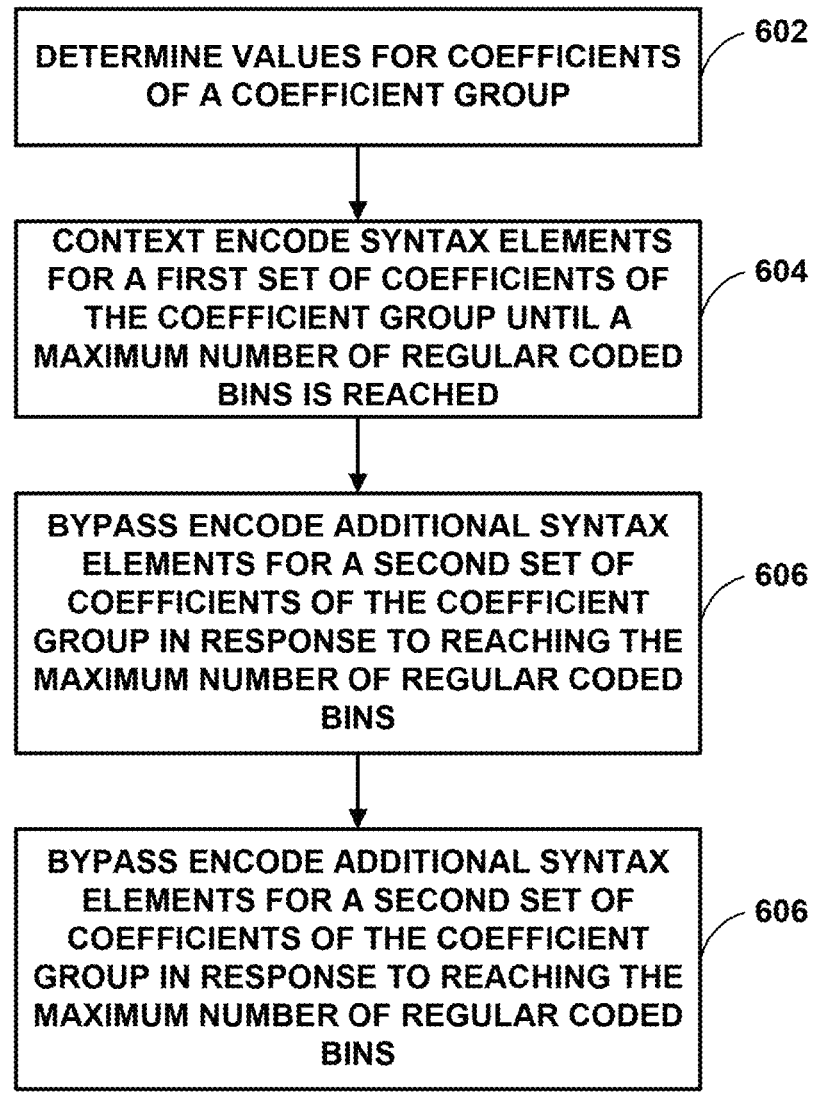
FIG. 13 is a flowchart illustrating an example operation of a video encoder for encoding a current block of video data.

FIG. 13 is a flowchart illustrating an example operation of a video encoder for encoding a current block of video data. The current block may, for example, be a transform unit or a transform block. Although described with respect to video encoder 200 (FIGS. 1 and 5), it should be understood that other devices may be configured to perform an operation similar to that of FIG. 13.

In the example of FIG. 13, video encoder 200 determines values for coefficients of a transform coefficient group (602) and context encodes syntax elements for a first set of coefficients of the transform coefficient group until a maximum number of regular coded bins is reached (604). The context encoded syntax elements include one or more significance flags indicating if an absolute level for a transform coefficient is equal to zero, one or more parity level flags indicating if a transform coefficient has an absolute level that is even or odd, and one or more first flags indicating if a transform coefficient has an absolute level that is greater than 2. To context encode the syntax elements of the transform coefficient group, video encoder 200 may be configured to perform context-adaptive binary arithmetic encoding to encode the syntax elements of the transform coefficient group. Video encoder 200 bypass encodes additional syntax elements for a second set of coefficients of the transform coefficient group in response to reaching the maximum number of regular coded bins (606).

Figure 14:
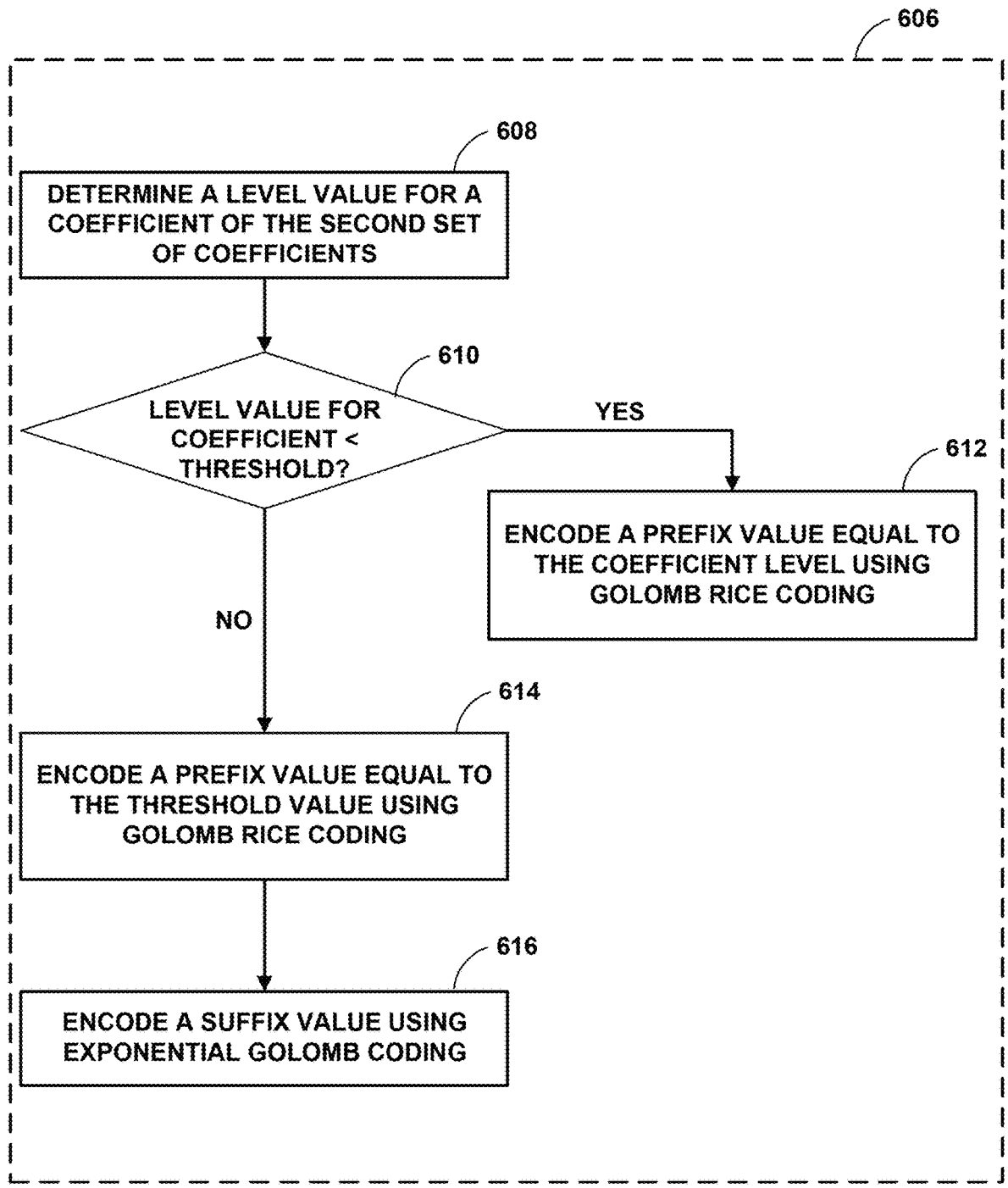
FIG. 14 is a flowchart illustrating an example operation of a video encoder for bypass encoding the additional syntax elements for the second set of coefficients of the transform coefficient group in FIG. 13.

FIG. 14 is a flowchart illustrating an example operation of a video encoder for bypass encoding the additional syntax elements for the second set of coefficients of the transform coefficient group. In this regard, FIG. 14 represents an example process that may correspond to block 606 of FIG. 13. In the example of FIG. 14, video encoder 200 determines a level value for a transform coefficient of the second set of coefficients (608). Video encoder 200 determines if the level value for the transform coefficient is less than a threshold value (610). If the transform coefficient is less than the threshold value (610), then video encoder 200 encodes a prefix value equal to the transform coefficient level using Golomb-Rice coding (612). Thus, video encoder 200 encodes the level for a transform coefficient that is less than the threshold value without encoding a suffix value for the transform coefficient.

If the transform coefficient is greater than the threshold value (610, No), then video encoder 200 encodes a prefix value equal to the threshold value using Golomb-Rice coding (614) and encodes a suffix value using exponential Golomb coding (616). Video encoder 200 may, for example, determine the suffix value by subtracting the prefix value from the level value for the transform coefficient. The level value for the transform coefficient may be either an absolute level value or a remaining level value.

Figure 15:
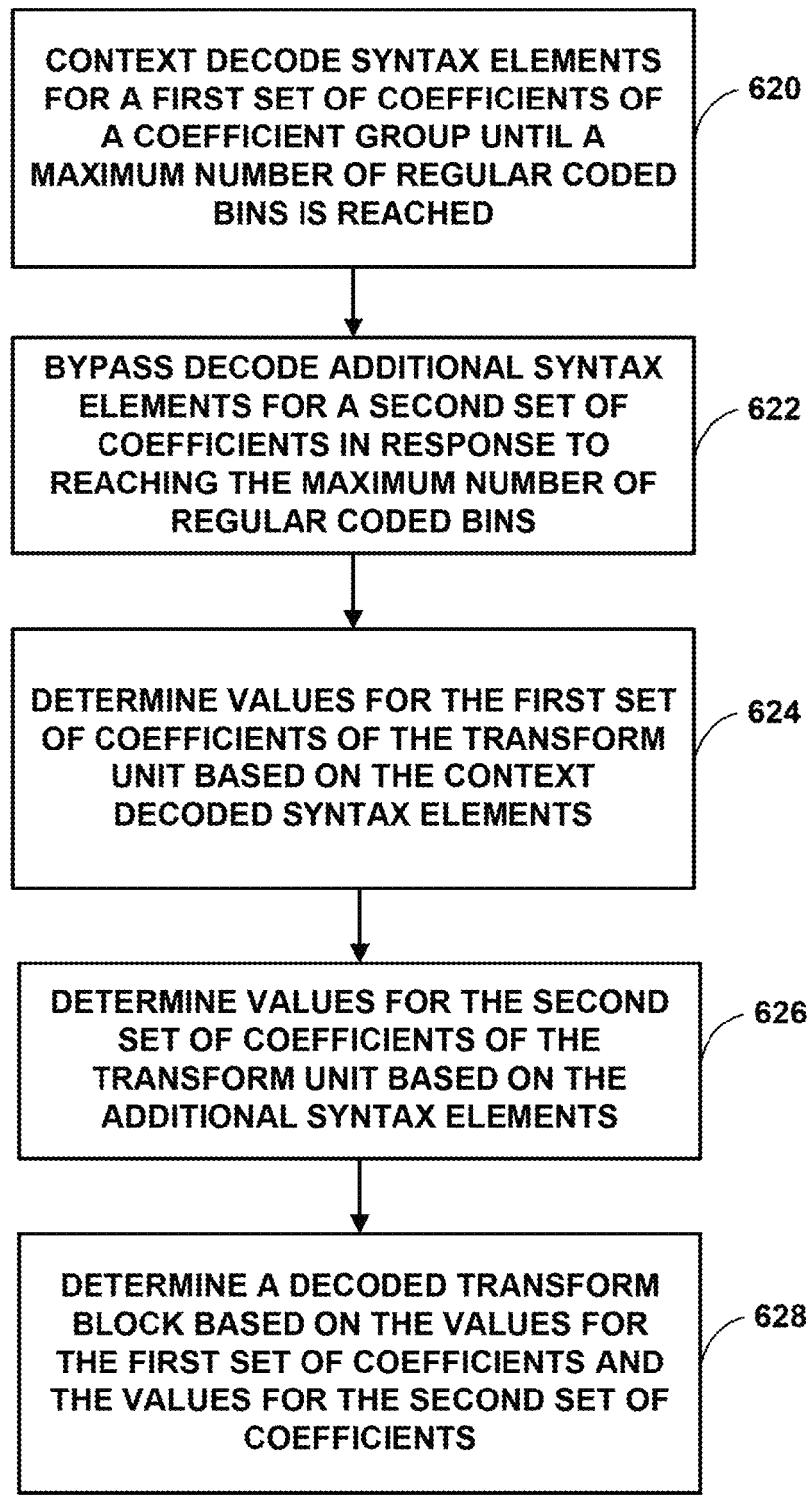
FIG. 15 is a flowchart illustrating an example operation of a video decoder for decoding a current block of video data.

FIG. 15 is a flowchart illustrating an example operation of a video decoder for decoding a current block of video data. The current block may, for example, be a transform unit or transform block. Although described with respect to video decoder 300 (FIGS. 1 and 6), it should be understood that other devices may be configured to perform an operation similar to that of FIG. 14.

In the example of FIG. 15, video decoder 300 context decodes syntax elements for a first set of coefficients of a transform coefficient group until a maximum number of regular coded bins is reached (620). The context encoded syntax elements include one or more significance flags indicating if an absolute level for a transform coefficient is equal to zero, one or more parity level flags indicating if a transform coefficient has an absolute level that is even or odd, and one or more first flags indicating if a transform coefficient has an absolute level that is greater than 2. To context decode the syntax elements of the transform coefficient group, video decoder may be configured to perform context-adaptive binary arithmetic decoding to decode the syntax elements of the transform coefficient group.

Video decoder 300 bypass decodes additional syntax elements for a second set of coefficients in response to reaching the maximum number of regular coded bins (622). Video decoder 300 determines values for the first set of coefficients of the transform unit based on the context decoded syntax elements (624) and determines values for the second set of coefficients of the transform unit based on the additional syntax elements (626). Video decoder 300 determines a decoded transform block based on the values for the first set of coefficients and the values for the second set of coefficients (628).

Figure 16:
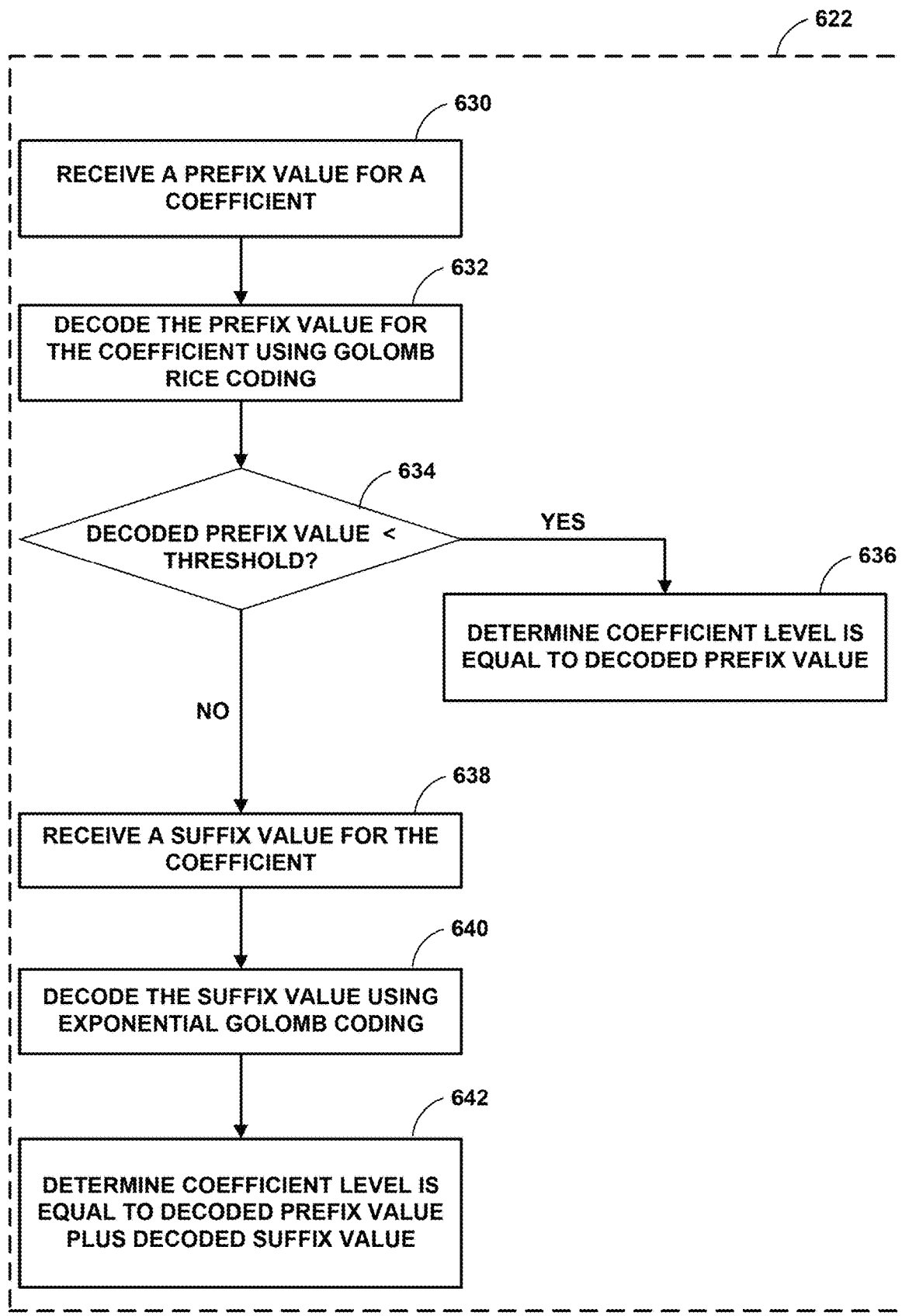
FIG. 16 is a flowchart illustrating an example operation of a video decoder for bypass decoding the additional syntax elements for the second set of coefficients of the coefficient group in FIG. 15.

FIG. 16 is a flowchart illustrating an example operation of a video decoder for bypass decoding the additional syntax elements for the second set of coefficients of the transform coefficient group. In this regard, FIG. 16 represents an example process that may correspond to block 622 of FIG. 15. In the example of FIG. 14, video decoder 300 receives a prefix value for a transform coefficient (630) and decodes the prefix value using Golomb-Rice coding (632). Video decoder 300 determines if the decoded prefix value is less than a threshold value (634). If the decoded prefix value is less than the threshold value (634, Yes), then video decoder 300 determines that the transform coefficient level is equal to the decoded prefix value. In this case, video decoder 300 determines the level value for the transform coefficient without receiving a suffix value.

If the decoded prefix value is greater than the threshold value (634, No), then video decoder 300 receives a suffix value for the transform coefficient (638) and decodes the suffix value using exponential Golomb coding (640). Video decoder 300 determine the level for the transform coefficients to be equal to the decoded prefix value plus the decoded suffix value (642).

It is to be recognized that depending on the example, certain acts or events of any of the techniques described herein can be performed in a different sequence, may be added, merged, or left out altogether (e.g., not all described acts or events are necessary for the practice of the techniques). Moreover, in certain examples, acts or events may be performed concurrently, e.g., through multi-threaded processing, interrupt processing, or multiple processors, rather than sequentially.

In one or more examples, the functions described may be implemented in hardware, software, firmware, or any combination thereof. If implemented in software, the functions may be stored on or transmitted over as one or more instructions or code on a computer-readable medium and executed by a hardware-based processing unit. Computer-readable media may include computer-readable storage media, which corresponds to a tangible medium such as data storage media, or communication media including any medium that facilitates transfer of a computer program from one place to another, e.g., according to a communication protocol. In this manner, computer-readable media generally may correspond to (1) tangible computer-readable storage media which is non-transitory or (2) a communication medium such as a signal or carrier wave. Data storage media may be any available media that can be accessed by one or more computers or one or more processors to retrieve instructions, code and/or data structures for implementation of the techniques described in this disclosure. A computer program product may include a computer-readable medium.

By way of example, and not limitation, such computer-readable storage media can include one or more of RAM, ROM, EEPROM, CD-ROM or other optical disk storage, magnetic disk storage, or other magnetic storage devices, flash memory, or any other medium that can be used to store desired program code in the form of instructions or data structures and that can be accessed by a computer. Also, any connection is properly termed a computer-readable medium. For example, if instructions are transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. It should be understood, however, that computer-readable storage media and data storage media do not include connections, carrier waves, signals, or other transitory media, but are instead directed to non-transitory, tangible storage media. Disk and disc, as used herein, includes compact disc (CD), laser disc, optical disc, digital versatile disc (DVD), floppy disk and Blu-ray disc, where disks usually reproduce data magnetically, while discs reproduce data optically with lasers. Combinations of the above should also be included within the scope of computer-readable media.

Instructions may be executed by one or more processors, such as one or more DSPs, general purpose microprocessors, ASICs, FPGAs, or other equivalent integrated or discrete logic circuitry. Accordingly, the term "processor," as used herein may refer to any of the foregoing structure or any other structure suitable for implementation of the techniques described herein. In addition, in some aspects, the functionality described herein may be provided within dedicated hardware and/or software modules configured for encoding and decoding, or incorporated in a combined codec. Also, the techniques could be fully implemented in one or more circuits or logic elements.

The techniques of this disclosure may be implemented in a wide variety of devices or apparatuses, including a wireless handset, an integrated circuit (IC) or a set of ICs (e.g., a chip set). Various components, modules, or units are described in this disclosure to emphasize functional aspects of devices configured to perform the disclosed techniques, but do not necessarily require realization by different hardware units. Rather, as described above, various units may be combined in a codec hardware unit or provided by a collection of interoperative hardware units, including one or more processors as described above, in conjunction with suitable software and/or firmware.

Various examples have been described. These and other examples are within the scope of the following claims.

What is claimed is:

1. A method of decoding video data, the method comprising:
    context decoding syntax elements for a first set of transform coefficients of a transform coefficient group until a maximum number of regular coded bins is reached, wherein the context decoded syntax elements comprise one or more significance flags, one or more parity level flags, and one or more first flags, wherein each of the one or more significance flags indicate if an absolute level for a transform coefficient is equal to zero, each of the one or more parity level flags indicates if a transform coefficient has an absolute level that is even or odd, and each of the one or more first flags indicates if a transform coefficient has an absolute level that is greater than 2;
    bypass decoding additional syntax elements for a second set of coefficients in response to reaching the maximum number of regular coded bins, wherein bypass decoding the additional syntax elements comprises:
        receiving a prefix value for a level value of a transform coefficient of the second set of coefficients;
        decoding the prefix value using Golomb-Rice coding;
        in response to a length of the prefix value being equal to a threshold length, receiving a suffix value for the level value of the transform coefficient, wherein the threshold length is a fixed value for all transform coefficients of the second set of coefficients; and
        decoding the suffix value using exponential Golomb coding;
    determining level values for the first set of coefficients of the transform unit based on the context decoded syntax elements; and
    determining level values for the second set of coefficients of the transform unit based on the additional syntax elements, wherein determining the level values for the second set of coefficients of the transform unit based on the additional syntax elements comprises determining the level value of the transform coefficient based on the decoded prefix value and the decoded suffix value.

2. The method of claim 1, wherein determining the level value of the transform coefficient comprises:
    adding the decoded prefix value to the decoded suffix value.

3. The method of claim 1, wherein bypass decoding the additional syntax elements further comprises:
    receiving a second prefix value for a level value of a second coefficient of the second set of coefficients;
    decoding the second prefix value using Golomb-Rice coding;
    in response to a length of the second prefix value being less than the threshold length, determining the level value of the second coefficient without receiving a suffix value for the level value of the second coefficient.

4. The method of claim 1, wherein bypass decoding the additional syntax elements further comprises:
    determining a value for a Rice parameter for the transform coefficient; and
    determining the threshold length based on the value for the Rice parameter.

5. The method of claim 1, wherein context decoding the syntax elements of the transform coefficient group comprises performing context-adaptive binary arithmetic decoding to decode the syntax elements of the transform coefficient group.

6. The method of claim 1, wherein the level value of the transform coefficient comprises an absolute level value.

7. The method of claim 1, wherein the level value of the transform coefficient comprises a remaining level value.

8. The method of claim 1, wherein the threshold length is equal to 5.

9. The method of claim 1, wherein the threshold value length is equal to 6.

10. The method of claim 1, further comprising:
    determining a decoded transform block based on the level values for the first set of coefficients and the level values for the second set of coefficients;
    adding the decoded transform block to a prediction block to determine a reconstructed block;
    performing one or more filtering operations on the reconstructed block to determine a decoded block of video data; and
    outputting a decoded picture of video data that includes the decoded block of video data.

11. A device for decoding video data, the device comprising:
    a memory configured to store video data; and
    one or more processors implemented in circuitry and configured to:
        context decode syntax elements for a first set of coefficients of a transform coefficient group until a maximum number of regular coded bins is reached, wherein the context decoded syntax elements comprise one or more significance flags, one or more parity level flags, and one or more first flags, wherein each of the one or more significance flags indicate if an absolute level for a transform coefficient is equal to zero, each of the one or more parity level flags indicates if a transform coefficient has an absolute level that is even or odd, and each of the one or more first flags indicates if a transform coefficient has an absolute level that is greater than 2;

bypass decode additional syntax elements for a second set of coefficients in response to reaching the maximum number of regular coded bins, wherein to bypass decode the additional syntax elements, the one or more processors are configured to:
receive a prefix value for a level value of a transform coefficient of the second set of coefficients;
decode the prefix value using Golomb-Rice coding;
in response to a length of the prefix value being equal to a threshold length, receive a suffix value for the level value of the transform coefficient, wherein the threshold length is a fixed value for all transform coefficients of the second set of coefficients; and
decode the suffix value using exponential Golomb coding;
determine level values for the first set of coefficients of the transform unit based on the context decoded syntax elements; and
determine level values for the second set of coefficients of the transform unit based on the additional syntax elements, wherein to determine the level values for the second set of coefficients of the transform unit based on the additional syntax elements, the one or more processors are configured to determine the level value of the transform coefficient based on the decoded prefix value and the decoded suffix value.

12. The device of claim 11, wherein to determine the level value of the transform coefficient, the one or more processors are configured to:
add the decoded prefix value to the decoded suffix value.

13. The device of claim 11, wherein to bypass decode the additional syntax elements, the one or more processors are configured to:
receive a second prefix value for a second coefficient of the second set of coefficients;
decode the second prefix value using Golomb-Rice coding;
in response to a length of the second prefix value being less than the threshold length, determine a level value of the second coefficient without receiving a suffix value for the second coefficient.

14. The device of claim 11, wherein to bypass decode the additional syntax elements, the one or more processors are configured to:
determine a value for a Rice parameter for the transform coefficient; and
determine the threshold length based on the value for the Rice parameter.

15. The device of claim 11, wherein to context decode the syntax elements of the transform coefficient group, the one or more processors are configured to perform context-adaptive binary arithmetic decoding to decode the syntax elements of the transform coefficient group.

16. The device of claim 11, wherein the level value of the transform coefficient comprises an absolute level value.

17. The device of claim 11, wherein the level value of the transform coefficient comprises a remaining level value.

18. The device of claim 11, wherein the threshold length is equal to 5.

19. The device of claim 11, wherein the threshold length is equal to 6.

20. The device of claim 11, wherein the one or more processors are configured to:
determine a decoded transform block based on the level values for the first set of coefficients and the level values for the second set of coefficients;
add the decoded transform block to a prediction block to determine a reconstructed block;
perform one or more filtering operations on the reconstructed block to determine a decoded block of video data; and
output a decoded picture of video data that includes the decoded block of video data.

21. A method of encoding video data, the method comprising:
determining level values for coefficients of a transform coefficient group;
context encoding syntax elements for a first set of coefficients of the transform coefficient group until a maximum number of regular coded bins is reached, wherein the context encoded syntax elements comprise one or more significance flags, one or more parity level flags, and one or more first flags, wherein each of the one or more significance flags indicate if an absolute level for a transform coefficient is equal to zero, each of the one or more parity level flags indicates if a transform coefficient has an absolute level that is even or odd, and each of the one or more first flags indicates if a transform coefficient has an absolute level that is greater than 2;
bypass encoding additional syntax elements for a second set of coefficients of the transform coefficient group in response to reaching the maximum number of regular coded bins, wherein bypass encoding the additional syntax elements comprises:
determining a level value of a transform coefficient of the second set of coefficients;
in response to the level value of the transform coefficient being greater than a threshold length, encoding a prefix value for the level value of the transform coefficient using Golomb-Rice coding, wherein the threshold length is a fixed value for all transform coefficients of the second set of coefficients; and
in response to the level value being greater than the threshold length, encoding a suffix value for the level value of the transform coefficient using exponential Golomb coding.

22. The method of claim 21, further comprising:
determining the suffix value by subtracting the prefix value from the level value of the transform coefficient.

23. The method of claim 21, wherein bypass encoding the additional syntax elements further comprises:
determining a second level value for a second coefficient of the second set of coefficients;
in response to the second level value being less than the threshold length, encoding a prefix value for the second coefficient using Golomb-Rice coding without encoding a suffix value for the second coefficient.

24. The method of claim 21, wherein bypass encoding the additional syntax elements further comprises:
determining a value for a Rice parameter for the transform coefficient; and
determining the threshold length based on the value for the Rice parameter.

25. The method of claim 21, wherein context encoding the syntax elements of the transform coefficient group comprises performing context-adaptive binary arithmetic encoding to encode the syntax elements of the transform coefficient group.

26. The method of claim 21, wherein the level value of the transform coefficient comprises an absolute level value.

27. The method of claim 21, wherein the level value of the transform coefficient comprises a remaining level value.

28. The method of claim 21, wherein the threshold length is equal to 5.

29. The method of claim 21, wherein the threshold length is equal to 6.

30. A device for encoding video data, the device comprising:
a memory configured to store video data; and
one or more processors implemented in circuitry and configured to:
determine level values for coefficients of a transform coefficient group;
context encode syntax elements for a first set of coefficients of the transform coefficient group until a maximum number of regular coded bins is reached, wherein the context encoded syntax elements comprise one or more significance flags, one or more parity level flags, and one or more first flags, wherein each of the one or more significance flags indicate if an absolute level for a transform coefficient is equal to zero, each of the one or more parity level flags indicates if a transform coefficient has an absolute level that is even or odd, and each of the one or more first flags indicates if a transform coefficient has an absolute level that is greater than 2;
bypass encode additional syntax elements for a second set of coefficients of the transform coefficient group in response to reaching the maximum number of regular coded bins, wherein bypass encoding the additional syntax elements comprises:
determine a level value of a transform coefficient of the second set of coefficients;
in response to the level value of the transform coefficient being greater than a threshold length, encode a prefix value for the level value of the transform coefficient using Golomb-Rice coding, wherein the threshold length is a fixed value for all transform coefficients of the second set of coefficients; and
in response to the level value being greater than the threshold length, encode a suffix value for the level value of the transform coefficient using exponential Golomb coding.

31. The device of claim 30, wherein the one or more processors are further configured to:
determine the suffix value by subtracting the prefix value from the level value of the transform coefficient.

32. The device of claim 30, wherein to bypass encode the additional syntax elements, the one or more processors are further configured to:
determine a second level value for a second coefficient of the second set of coefficients;
in response to the second level value being less than the threshold length, encode a prefix value for the second coefficient using Golomb-Rice coding without encoding a suffix value for the second coefficient.

33. The device of claim 30, wherein to bypass encode the additional syntax elements the one or more processors are further configured to:
determine a value for a Rice parameter for the transform coefficient; and determine the threshold length based on the value for the Rice parameter.

34. The device of claim 30, wherein to context encode the syntax elements of the transform coefficient group, the one or more processors are configured to perform context-adaptive binary arithmetic encoding to encode the syntax elements of the transform coefficient group.

35. The device of claim 30, wherein the level value of the transform coefficient comprises an absolute level value.

36. The device of claim 30, wherein the level value of the transform coefficient comprises a remaining level value.

37. The device of claim 30, wherein the threshold length is equal to 5.

38. The device of claim 30, wherein the threshold length is equal to 6.

39. A non-transitory computer readable storage medium storing instructions that when executed by one or more processors cause the one or more processors to:
context decode syntax elements for a first set of transform coefficients of a transform coefficient group until a maximum number of regular coded bins is reached, wherein the context decoded syntax elements comprise one or more significance flags, one or more parity level flags, and one or more first flags, wherein each of the one or more significance flags indicate if an absolute level for a transform coefficient is equal to zero, each of the one or more parity level flags indicates if a transform coefficient has an absolute level that is even or odd, and each of the one or more first flags indicates if a transform coefficient has an absolute level that is greater than 2;
bypass decode additional syntax elements for a second set of coefficients in response to reaching the maximum number of regular coded bins, wherein to bypass decode the additional syntax elements, the instructions cause the one or more processors to:
receive a prefix value for a level value of a transform coefficient of the second set of coefficients;
decode the prefix value using Golomb-Rice coding;
in response to a length of the prefix value being equal to a threshold length, receive a suffix value for the level value of the transform coefficient, wherein the threshold length is a fixed value for all transform coefficients of the second set of coefficients; and
decode the suffix value using exponential Golomb coding;
determine level values for the first set of coefficients of the transform unit based on the context decoded syntax elements; and
determine level values for the second set of coefficients of the transform unit based on the additional syntax elements, wherein determining the level values for the second set of coefficients of the transform unit based on the additional syntax elements comprises determining the level value of the transform coefficient based on the decoded prefix value and the decoded suffix value.

40. An apparatus for decoding video data, the apparatus comprising:
means for context decoding syntax elements for a first set of transform coefficients of a transform coefficient group until a maximum number of regular coded bins is reached, wherein the context decoded syntax elements comprise one or more significance flags, one or more parity level flags, and one or more first flags, wherein each of the one or more significance flags indicate if an absolute level for a transform coefficient is equal to zero, each of the one or more parity level flags indicates if a transform coefficient has an absolute level that is even or odd, and each of the one or more first flags indicates if a transform coefficient has an absolute level that is greater than 2;

means for bypass decoding additional syntax elements for a second set of coefficients in response to reaching the maximum number of regular coded bins, wherein the means for bypass decoding the additional syntax elements comprises:
   means for receiving a prefix value for a level value of a transform coefficient of the second set of coefficients;
   means for decoding the prefix value using Golomb-Rice coding;
   means for receiving a suffix value for the level value of the transform coefficient in response to a length of the prefix value being equal to a threshold length, wherein the threshold length is a fixed value for all transform coefficients of the second set of coefficients; and
   means for decoding the suffix value using exponential Golomb coding;

means for determining level values for the first set of coefficients of the transform unit based on the context decoded syntax elements; and means for determining level values for the second set of coefficients of the transform unit based on the additional syntax elements, wherein determining the level values for the second set of coefficients of the transform unit based on the additional syntax elements comprises determining the level value of the transform coefficient based on the decoded prefix value and the decoded suffix value.

* * * * *